(12) United States Patent
Ikuta et al.

(10) Patent No.: US 7,504,185 B2
(45) Date of Patent: Mar. 17, 2009

(54) METHOD FOR DEPOSITING MULTI-LAYER FILM OF MASK BLANK FOR EUV LITHOGRAPHY AND METHOD FOR PRODUCING MASK BLANK FOR EUV LITHOGRAPHY

(75) Inventors: Yoshiaki Ikuta, Schenectady, NY (US); David Krick, Port Matilda, PA (US); Hsing Chign Ma, Fremont, CA (US)

(73) Assignee: Asahi Glass Company, Limited, Tokyo (JP)

( * ) Notice: Subject to any disclaimer, the term of this patent is extended or adjusted under 35 U.S.C. 154(b) by 526 days.

(21) Appl. No.: 11/240,437

(22) Filed: Oct. 3, 2005

(65) Prior Publication Data

US 2007/0077499 A1    Apr. 5, 2007

(51) Int. Cl.
*G03F 1/00* (2006.01)
(52) U.S. Cl. .......................................... 430/5
(58) Field of Classification Search .................. 430/5; 204/192.11, 298.04; 378/35
See application file for complete search history.

(56) References Cited

U.S. PATENT DOCUMENTS

| | | | |
|---|---|---|---|
| 6,319,635 B1 | 11/2001 | Mirkarimi et al. | |
| 6,488,821 B2 * | 12/2002 | Baldwin et al. | ........ 204/192.11 |
| 6,489,066 B2 | 12/2002 | Mirkanimi | |
| 2004/0175633 A1 | 9/2004 | Shoki et al. | |
| 2004/0231980 A1 | 11/2004 | Takahashi | |
| 2005/0118533 A1 | 6/2005 | Mirkarimi et al. | |
| 2006/0008749 A1 * | 1/2006 | Sobel et al. | .................. 430/394 |
| 2006/0024589 A1 * | 2/2006 | Schwarzl et al. | ............... 430/5 |
| 2006/0040418 A1 * | 2/2006 | Takaoka | ....................... 438/14 |

OTHER PUBLICATIONS

U.S. Appl. No. 11/330,205, filed Jan. 12, 2006, Ikuta et al.
P.B. Mirkarimi, et al., "Advancing the Ion Beam Thin Film Planarization Process for the Smoothing of Substrate Particles", Microelectronic Engineering, XP 4809333, vol. 77, Jan. 21, 2005.
"Specification for Extreme Ultraviolet Lithography Mask Substrates", SEMI P37-1102, Nov. 2001, pp. 1-10.
"Specification for Absorbing Film Stacks and Multilayers on Extreme Ultraviolet Lithography Mask Blanks", SEMI P38-1102, Sep. 2002, pp. 1-8.
Alan Stivers, et al., "Evaluation of the Capability of a Multibeam Confocal Inspection System for Inspection of EUVL Mask Blanks", Proceedings of SPIE, vol. 4889, Oct. 1, 2002, pp. 408-417.

(Continued)

*Primary Examiner*—Stephen Rosasco
(74) *Attorney, Agent, or Firm*—Oblon, Spivak, McClelland, Maier & Neustadt, P.C.

(57) ABSTRACT

A method for depositing, by ion beam sputtering, a multilayer reflective coating of a reflective mask blank for EUV lithography on a substrate having a concave defect formed thereon, characterized in that the method comprises carrying out ion beam sputtering so that an absolute value of an angle $\alpha$ formed between a normal line of a substrate and sputtered particles landing on the substrate is maintained so as to satisfy the formula of $35° \leq \alpha \leq 80°$ while rotating the substrate about a central axis thereof.

10 Claims, 11 Drawing Sheets

OTHER PUBLICATIONS

Stefan P. Hau-Riege, et al., "Defect repair for extreme ultraviolet lithography (EUVL) mask blanks", Proceedings of SPIE, vol. 5037, Jun. 16, 2003, pp. 331-338.
P. B. Mirkarimi, et al., "Advancing the Ion Beam Thin Film Planarization Process for the Smoothing of Substrate Particles", Microelectronic Engineering, XP 4809333, vol. 77, 2005, pp. 369-381.
"Specification For Extreme Ultraviolet Lithography Mask Substrates", SEMI P37-1102, 2002, pp. 1-10.
"Specification For Absorbing Film Stacks and Multilayers on Extreme Ultraviolet Lithography Mask Blanks", SEMI P38-1102, 2002, pp. 1-8.
Alan Stivers, et al., "Evaluation of the Capability of a Multibeam Confocal Inspection System for Inspection of EUVL Mask Blanks", Proceedings of SPIE, vol. 4889, 2002, pp. 408-417.
Stefan P. Hau-Riege, et al., "Defect repair for extreme ultraviolet lithography (EUVL) mask blanks", Proceedings of SPIE vol. 5037, 2003, pp. 331-338.
Paul B. Mirkarimi, et al., "Developing a viable multilayer coating process for extreme ultraviolet lithography reticles", J. Microlith., Microfab., Microsyst., vol. 3, No. 1, Jan. 2004, pp. 139-145.

* cited by examiner

→ PSL equivalent particle size 37 nm
→ PSL equivalent particle size 52 nm

METHOD FOR DEPOSITING MULTI-LAYER FILM OF MASK BLANK FOR EUV LITHOGRAPHY AND METHOD FOR PRODUCING MASK BLANK FOR EUV LITHOGRAPHY

BACKGROUND OF THE INVENTION

1. Field of the Invention

The present invention relates to a method for depositing a multilayer film of a mask blank for EUV (Extreme Ultra Violet) lithography by using an ion beam sputtering method, and a method for producing a mask blank for EUV lithography.

2. Discussion of Background

A reflective coating of a mask blank for EUV lithography (hereinbelow, referred to as "EUV mask blank" in Description) is produced by depositing a multilayer reflective coating, wherein Mo layers and Si layers are alternately laminated on a superpolished substrate. In order to fabricate an EUV mask blank at a reasonable cost, such a multilayer reflective coating is required to satisfy the following characteristics:

Being free of a defect having a size of a certain value or above (a size of 32 nm or above in the case of, e.g., a mask used for fabricating semiconductor devices having a circuit line width of 32 nm) in a quality-assured range (142×142 mm square at a central portion in the case of a 6 inch mask).

Having a high reflectivity in a stable and uniform way in the quality-assured range with respect to the wavelength of a light source (normally 13.5 nm)

In a case wherein a fine irregularity exists on a substrate, when an attempt is made to print a desired pattern of a mask on a photosensitive organic film (a so-called photoresist film) on a Si wafer by using an exposing system, a portion of the desired pattern is defective, or an excessive pattern other than the desired pattern is formed in some cases since the periodic structure of a multilayer reflective coating formed on the substrate is perturbed. The perturbation in the periodic structure of a multilayer reflective coating, which is caused by an irregularity existing on a substrate, is called a phase defect, which causes a important problem. It is desired that no irregularity having a size of a certain value or above exist on a substrate. Non-patent documents 1 and 2 describe requirements relating to a defect in an EUV mask and an EUV mask blank. The requirements for the defect are significantly severe. Non-patent document 1 describes that a defect having a size of 50 nm or above is not permissible since the presence of such a defect on a substrate perturbs the structure of a reflective coating to form an unexpected shape in a pattern projected onto a resist on a Si wafer. Additionally, non-patent document 1 describes that the surface roughness of a substrate needs to be less than 0.15 nm in RMS (root-mean-square) in order to prevent the roughness of a line edge from increasing in a pattern projected onto a resist on a Si wafer.

Non-patent document 2 describes that it is not permissible that a defect having a size of 25 nm or above exists on a reticle having a reflective coating, which is used in EUV lithography.

Non-patent document 3 describes what size of defect on a substrate can be printed. Non-patent document 3 describes that there is a possibility that a phase defect modifies a line width of a printed image. A phase defect including a surface bump having a height of 2 nm and a FWHM (full width of half maximum) of 60 nm is a borderline phase defect as to whether the phase defect can be printed or not. This document describes that a defect having such a size causes an impermissible change of 20% in line width (140 nm on a mask) with respect to a line having a width of 35 nm.

Non-patent document 4 describes defect repair for EUVL mask blanks. Non-patent document 4 describes that a defect caused in the vicinity of the bottom of a reflective coating tends to change the phase of reflected light, and that such a defect is called a phase defect. The perturbation in the structure of a reflective coating caused by a phase defect can be reduced by irradiation of an electron beam having a high resolution. An increase in the temperature at an irradiated spot causes a silanization reaction between Mo and Si, leading to volume compaction.

Several techniques have been proposed for satisfying the severe requirements for such a defect stated above. One of the techniques is detect smoothing by use of a secondary ion source, and another one is use of an underlayer. Non-patent document 5 describes the former one, and the patent documents 1 and 2 describe the latter one.

Non-patent document 5 describes a method for smoothing out a thin film by an ion beam given by a secondary ion source, which has been developed for mitigating the effect of minute contaminants on a substrate, and which is called "defect smoothing". In this method, a sputtering method, which is assisted by a primary ion source, is utilized to additionally deposit a Si film having a thickness of 1.4 nm or below, and a sputtering method using a secondary ion source is utilized to remove the deposited Si film by etching. By utilizing this method, foreign particles having a particle size of about 50 nm on a substrate can be smoothed out so as to have a height of 1 nm or below without having an adverse effect on the substrate.

Patent document 1 describes that an underlayer comprising a multilayer film is deposited as a film between a substrate and a reflective coating in order to make a defect size on a substrate as small as possible. This document also describes that the reduction in the defect size can be controlled by surface relaxation during the underlayer growth process using an ion beam sputtering system and by volume contraction of the materials at the multilayer interfaces.

Patent document 2 describes that an underlayer is disposed between a substrate and a reflective coating in order to make a defect size on a substrate as small as possible. The underlayer is disposed by a plurality of sequentially deposited and annealed coatings on the substrate. The annealing process can cause volume contraction of the coating material, mitigating the effect caused by a substrate defect.

Non-patent document 1: SEMI, P37-1102 (2002), "Specification for extreme ultraviolet lithography mask substrate"

Non-patent document 2: SEMI, P38-1102 (2002), "Specification for absorbing film stacks and multilayers on extreme ultraviolet lithography mask blanks"

Non-patent document 3: SPIE, vol. 4889, Alan Stivers., et. al., p. 408-417 (2002), "Evaluation of the Capability of a Multibeam Confocal Inspection System for Inspection of EUVL Mask Blanks"

Non-patent document 4: SPIE, vol. 5037, Stefan P. Hau Riege., et. al., p. 331-338 (2002), "Defect repair for extreme ultraviolet lithography (EUVL) mask blanks"

Non-patent document 5: Journal of Microlith., Microfab., and Microsys. 3, 139 (2004), Paul B. Mirkarimi, et. Al., "Developing a viable multilayer coating process for extreme ultraviolet lithography reticles"

Patent document 1: U.S. Pat. No. 6,319,635

Patent document 2: U.S. Pat. No. 6,489,066

SUMMARY OF THE INVENTION

However, the defect smoothing method proposed by the non-patent document 5 cannot mitigate the effect caused by a concave defect on a substrate since this method mitigates only the effect caused by a convex defect on a substrate. In Description, the convex defect means a defect formed as a convex portion on (projecting from) a substrate surface, such as a foreign particle or a fiber. On the other hand, the concave defect means a defect formed as a concave portion on (caved in) a substrate surface, such as a pit or a scratch.

This defect smoothing method utilizes dependency of an etching rate with respect to the incidence angle of ions to a target. In other words, a case, wherein sputtering is performed with the incidence angle of ions set at an off-normal angle, usually has a higher etching rate than a case, wherein sputtering is performed with the incidence angle of ions set at a normal angle. In Description, the normal angle means an angle of 0° with respect to a normal line of a substrate, and the off-normal angle means an angle other than an angle of 0° with respect to a normal line of a substrate.

In the defect smoothing method proposed by the non-patent document 5, a portion of a film, which is located on a sidewall of a convex defect, is reduced in size by being more deeply etching than a portion of film, which is located on a flat surface of a substrate. However, in this method, a concave defect is increased in size by the same mechanism. This is one of the disadvantages of this method. Additionally, this method is a time-consuming method since a film-etching process using a secondary ion source is required after a film deposition process using a primary ion source is carried out. Ions from the secondary ion source collide with not only a front surface of the substrate but also a shield, causing shield flaking. Accordingly, the secondary ion source generates new foreign particles in itself. The number of foreign particles in a case wherein the defect smoothing method using a secondary ion source is carried out is three to five times greater than the number of foreign particles in a case wherein the defect smoothing method is not carried out.

It is unclear whether the techniques proposed by patent documents 1 and 2 have an effect on a concave defect or not. Even if the proposed techniques have an effect on a concave defect, these techniques need use of a secondary ion source and/or implementation of annealing because of increasing the number of films to reduce the volume of a defect. The use of a secondary ion source generates additional contamination as stated above. The implement of annealing needs to take more time, thus increasing the possibility that foreign particles are generated during this process.

It is an object of the present invention to solve the problems of the prior art stated above and to provide a method for depositing a multilayer reflective coating of an EUV mask blank, which is capable of mitigating the effect caused by a concave defect existing on a substrate surface, such as a pit or a scratch.

It is another object of the present invention to provide a method for fabricating a reflective mask blank for EUV lithography, which is capable of mitigating the effect caused by a concave defect existing on a substrate surface.

It is another object of the present invention to provide a method for depositing a multilayer reflective coating, which is capable of smoothing out a substrate surface by film deposition of an underlayer.

It is another object of the present invention to provide a method for fabricating a reflective mask blank for EUV lithography, which is capable of mitigating the effect caused by a concave defect existing on a substrate surface and of counteracting a stress caused in a multilayer reflective coating to prevent the substrate from being deformed by the stress.

In order to attain the above-mentioned objects, the present invention provides the methods defined in items (1) to (10) stated below:

(1) A method for depositing, by ion beam sputtering, a multilayer reflective coating of a reflective mask blank for EUV lithography on a substrate having a concave defect formed thereon, comprising:

carrying out ion beam sputtering so that an absolute value of an angle $\alpha$ formed between a normal line of a substrate and sputtered particle landing on the substrate is maintained so as to satisfy the formula of $35°\leq\alpha\leq 80°$ while rotating the substrate about a central axis thereof.

(2) The method in item 1, further comprising:

depositing a capping layer on the multilayer reflective coating by ion beam sputtering; and carrying out the ion beam sputtering so that an absolute value of an angle $\alpha$ formed between a normal line of the substrate and sputtered particle falling on the substrate is maintained so as to satisfy the formula of $35°\leq\alpha\leq 80°$ while rotating the substrate about a central axis thereof, when depositing the capping layer on the multilayer reflective coating.

(3) A method for depositing, by ion beam sputtering, an underlayer of a reflective mask blank for EUV lithography on a substrate having a concave defect formed thereon, comprising:

carrying out ion beam sputtering so that an absolute value of an angle $\alpha$ formed between a normal line of a substrate and sputtered particle falling on the substrate is maintained so as to satisfy the formula of $35°\leq\alpha\leq 80°$ while rotating the substrate about a central axis thereof, when depositing an underlayer on the substrate.

(4) The method according to item 3, further comprising depositing a multilayer reflective coating of a reflective mask blank for EUV lithography on the underlayer by sputtering.

(5) A method for depositing a multilayer reflective coating of a reflective mask blank for EUV lithography on a substrate having a concave defect formed thereon, comprising:

depositing an underlayer on a substrate by ion beam sputtering, and depositing a multilayer reflective coating on the underlayer by ion beam sputtering;

carrying out the ion beam sputtering so that an absolute value of an angle $\alpha$ formed between a normal line of the substrate and sputtered particle landing on the substrate is maintained so as to satisfy the formula of $35°\leq\alpha\leq 80°$ while rotating the substrate about a central axis thereof, when depositing the underlayer and when depositing the multilayer reflective coating.

(6) The method according to item 5, further comprising:

depositing a capping layer on the multilayer reflective coating by ion beam sputtering; and carrying out the ion beam sputtering so that an absolute value of an angle $\alpha$ formed between a normal line of the substrate and sputtered particle falling on the substrate is maintained so as to satisfy the formula of $35°\leq\alpha\leq 80°$ while rotating the substrate about a central axis thereof, when depositing the capping layer.

(7) A method for fabricating a reflective mask blank for EUV lithography, comprising:

depositing a multilayer reflective coating on a substrate by the method defined in item 1; followed by depositing an absorbing layer on the multilayer reflective coating by sputtering.

(8) A method for fabricating a reflective mask blank for EUV lithography, comprising:

depositing an underlayer on a substrate by the method defined in item 3; followed by depositing a multilayer reflective coating of a reflective mask blank for EUV lithography on the underlayer by sputtering, and then;

depositing an absorbing layer on the multilayer reflective coating by sputtering.

(9) A method for fabricating a reflective mask blank for EUV lithography, comprising:

depositing an underlayer and a multilayer reflective coating on a substrate by the method defined in item 5; followed by depositing an absorbing layer on the multilayer reflective coating by sputtering.

(10) A method for fabricating a reflective mask blank for EUV lithography, comprising:

depositing an underlayer and a multilayer reflective coating on a substrate by the method defined in item 5; followed by depositing a capping layer on the multilayer reflective coating by ion beam sputtering, and depositing an absorbing layer on the capping layer by sputtering, and;

carrying out the ion beam sputtering so that an absolute value of an angle α formed between a normal line of the substrate and sputtered particle falling on the substrate is maintained so as to satisfy the formula of $35° \leq \alpha \leq 80°$ while rotating the substrate about a central axis thereof, when depositing the capping layer.

In accordance with the methods of the present invention, it is possible to mitigate the effect on a multilayer reflective coating caused by a concave defect formed on a substrate surface by controlling only a film deposition parameter for sputtered particles, specifically an angle α (the absolute value of an angle α) formed between a normal line of the substrate and the sputtered particles landing on the substrate. Thus, it is possible to use a substrate having a comparatively rough surface. This is advantageous for preparation of a substrate having no foreign particles existing thereof.

A convex defect formed on a substrate surface can be removed by a conventional wet cleaning method using fluorinated acid or ammonia water. A convex defect formed on a substrate surface can be also removed by brush-cleaning. However, when using a wet cleaning method using fluorinated acid or ammonia water, it is necessary to subject the substrate surface to slight etching in order to remove such a convex defect from the substrate by lift-off technique. This etching increases the surface roughness of the substrate. This etching also causes a concave defect on the substrate surface. Brush-cleaning is also accompanied by problems, such as an increase in the surface roughness of the substrate, and the generation of a concave defect on the substrate surface.

Accordingly, it is extremely difficult to prepare a substrate having neither a-convex defect nor a concave defect formed thereon. On the other hand, it is comparatively easy to use a conventional wet cleaning method or brush-cleaning to prepare a substrate, which has a relatively rough surface and/or a concave defect formed thereon, and which has no foreign particles existing thereon. In this sense, the methods according to the present invention is effective to fabricate a reflective mask blank for EUV lithography (hereinbelow, referred as "EUV mask blank" in Description), which is free from a convex defect and a concave defect.

BRIEF DESCRIPTION OF THE DRAWINGS

FIG. 3 are schematic views showing a relationship between an angle α and the film thickness of each multilayer reflective coating, wherein FIG. 3(a) shows a substrate before film deposition, FIG. 3(b) shows a state after film deposition of a multilayer reflective coating at an angle α ($\alpha<\alpha'$), and FIG. 3(c) shows a state after film deposition of a multilayer reflective coating at an angle α ($\alpha>\alpha'$);

FIG. 6 shows AFM images in the vicinity of a concave defect, which was obtained by depositing a Mo/Si multilayer reflective coating (having a film thickness of 7 nm) at an angle α=−28°, wherein FIG. 6(a) shows an AFM image before film deposition, and FIG. 6(b) shows an AFM image after film deposition;

FIG. 7 shows AFM images in the vicinity of a concave defect, which was obtained by depositing a Mo/Si multilayer reflective coating (having a film thickness of 7 nm) at an angle α=50°, wherein FIG. 7(a) shows an AFM image before film deposition, and FIG. 7(b) shows an AFM image after film deposition;

FIGS. 9(a) to (c) are graphs showing relationships of the sizes of concave defects before and after film deposition, wherein FIG. 9(a) shows a relationship among the sizes of concave defects before and after film deposition in a case of depositing a multilayer reflective coating at an angle α=−28°, FIG. 9(b) shows a relationship among the sizes of concave defects before and after film deposition in a case of depositing a multilayer reflective coating at an angle α=50°, and FIG. 9(c) shows a relationship among the sizes of concave defects before and after film deposition in a case of depositing a multilayer reflective coating at an angle α=70°.

EXPLANATION OF REFERENCE NUMERALS

Figure 1:
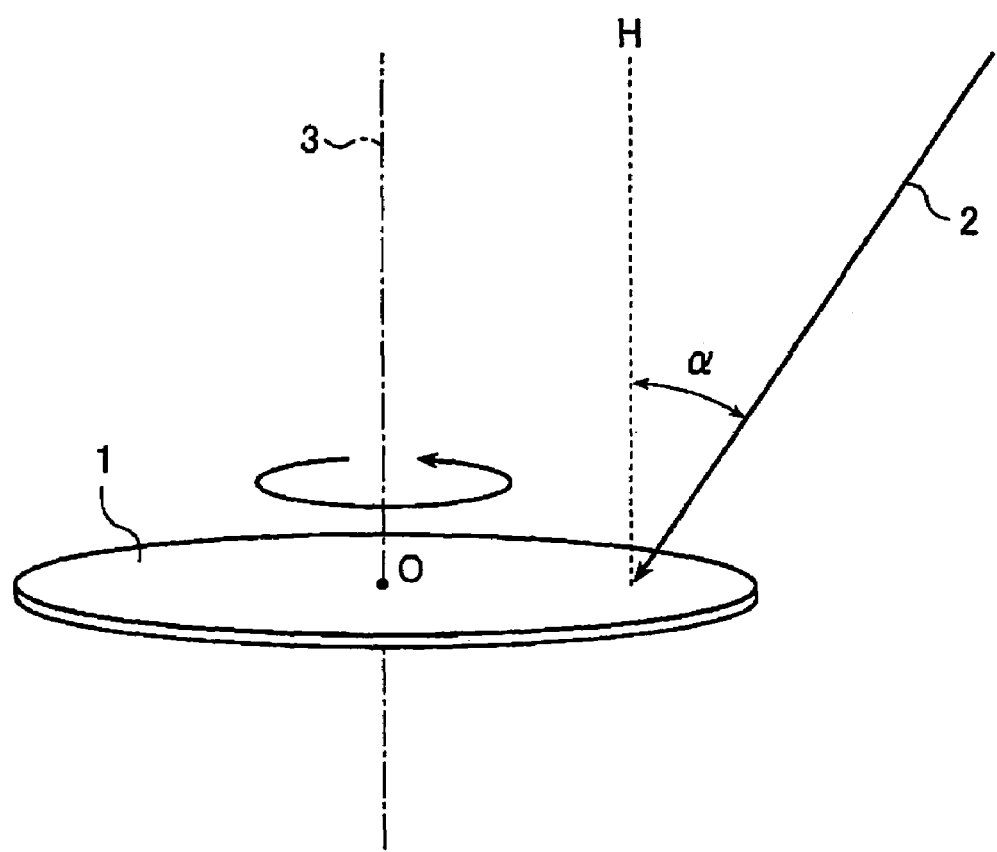
FIG. 1 is a schematic view explaining a first film deposition method according to the present invention.

1: substrate for film deposition
1a: flat substrate surface
1b: concave defect
2: sputtered particles
3: central axis
10, 10a and 10b: multilayer reflective coating
20: chamber
21: ion source
22: sputtering target

DETAILED DESCRIPTION OF THE INVENTION

A first embodiment according to the present invention relates to a method for depositing a multiplayer reflective coating an EUV mask blank on a substrate by an ion beam sputtering method (hereinbelow referred to as "the first film deposition method according to the present invention").

When the first film deposition method according to the present invention is carried out, a surface of a preprepared substrate for film deposition is first polished by abrasive grains, such as a cerium oxide, a zirconium oxide or colloidal silica, is cleaned by an acid solution, such as fluorinated acid, silicofluoric acid or sulfuric acid, by an alkaline solution, such as ammonia water or by pure water and is dried. If a convex defect, such as a foreign particle or a fiber, exists on the substrate surface, the convex defect is removed by these steps.

The first film deposition method according to the present invention is favorably applied to a substrate surface for film deposition after surface polishing and cleaning, more specifically to the film deposition surface of a substrate, on which a concave defect is formed. In Description, the substrate for film deposition means a substrate, which has a concave defect formed on a surface thereof. As stated above, the concave defect means a defect formed as a concave portion on (caved in) a substrate surface, such as a pit or a scratch.

A substrate used for application of an EUV mask blank is required to have a high smoothness and a high flatness. Specifically, the substrate for film deposition is required to have a smooth surface having a surface roughness of 0.15 nm or below in Rms (root mean square) and a flatness of 50 nm or below. However, since it is difficult to obtain a substrate having a completely smooth surface, a concave defect called a pit or a scratch exists on a substrate surface in some cases.

When the size of a concave defect formed on the film deposition surface of a substrate is quite small, the concave defect has no adverse effect on a multilayer reflective coating since the concave defect is plugged in a film deposition process of the multilayer reflective coating. However, when a concave defect, which has a size of a certain value or above, is deformed on a substrate surface, a concave defect appears on the surface of a multilayer reflective coating after film deposition, causing a defect in the multilayer reflective coating, in some cases. The reason will be described later. The size of a concave defect, which is permitted to exist on the film deposition surface of a substrate to be used in the present invention, is 32 nm or below in terms of polystyrene latex (PSL) equivalent particle size.

It is preferred that the substrate for film deposition have a low thermal expansion coefficient (preferably of $0\pm1.0\times10^{-7}/°$ C., more preferably of $0\pm0.3\times10^{-7}/°$ C.) in addition to being excellent at smoothness and flatness. A specific example of the substrate having a low thermal expansion coefficient is a substrate made of glass having a low thermal expansion coefficient, such as $SiO_2/TiO_2$ glass. However, the substrate for film deposition is not limited to be of this type. It is acceptable to use a substrate made of crystallized glass with a β-quartz solid solution precipitated, quartz glass, silicon, or metal.

Since the substrate with a multilayer reflective coating deposited thereon is used as an EUV mask blank after having a buffer layer and an absorbing layer formed thereon, it is preferred that the substrate for film deposition have excellent resistance to a cleaning liquid to be used for, e.g., cleaning a photomask after formation of an EUV mask blank or a pattern.

In order to prevent the multilayer reflective coating from being deformed by a film stress, it is preferred that the substrate for film deposition have a high rigidity. It is particularly preferred that the substrate have a high Young's modulus of 65 GPa or above.

The size and the thickness of the substrate for film deposition are properly determined by, e.g., design values of a mask. A specific example of the substrate is a substrate having outer dimensions of about 6 inch (152.4 mm) square and a thickness of about 0.25 inch (6.3 mm).

In the first film deposition method according to the present invention, when a multilayer reflective coating is deposited on a substrate by an ion beam sputtering method, ion beam sputtering is performed so that the absolute value of an angle α formed between a normal line of the substrate and the incidence angle of sputtered particles landing on the substrate is maintained at a certain angle, specifically so as to satisfy the formula of $35°\leq\alpha\leq 80°$ while rotating the substrate about the central axis of the substrate. The absolute value of the angle α means that even when the angle α is a negative angle as in an example stated later, the absolute value of the negative angle is maintained so as to satisfy the formula of $35°\leq\alpha\leq 80°$. In Description, when it is stated that the angle α is maintained so as to satisfy the formula of $35°\leq\alpha\leq 80°$, it is meant that the absolute value of the angle α is maintained so as to satisfy the formula of $35°\leq\alpha\leq 80°$.

FIG. 1 is a schematic view explaining the first film deposition method according to the present invention and showing a positional relationship between a substrate and sputtered particles landing on the substrate.

In FIG. 1, the substrate 1 having a circular shape rotates about the axis (central axis) 3 passing through the center O thereof. The central axis is the axis passing through the center of the substrate. When the substrate is formed in a circular shape, the central axis is the axis passing through the center of the circular shape. When the substrate is shaped in a square shape or a rectangular shape, the central axis is the axis passing through the intersection of diagonal lines of the square shape or rectangular shape.

In FIG. 1, a line 2 designates sputtered particles landing on the substrate 1, and a line H designates a normal line of the substrate 1. The line 2 and the line H form an angle α.

Figure 2:
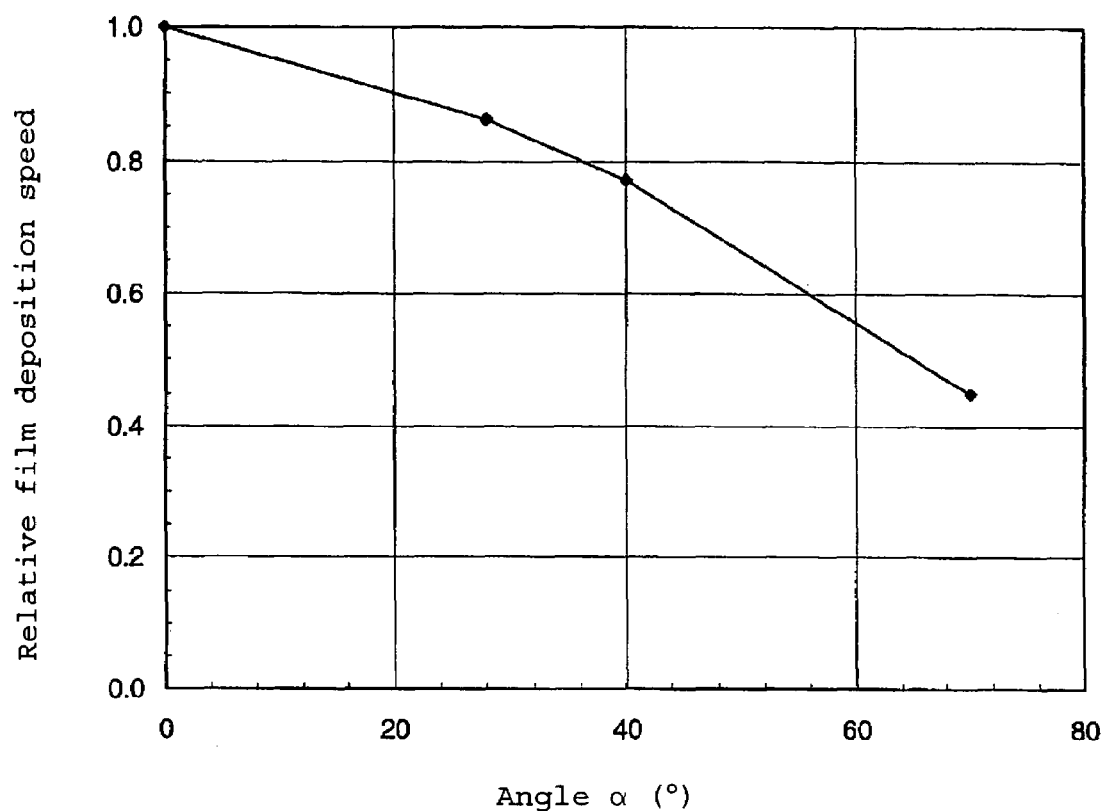
FIG. 2 is a graph showing a relationship between an angle α and a film deposition speed of a multilayer reflective coating.

The film deposition rate of a multilayer reflective coating on a flat substrate surface depends on the angle α, which is included between the normal line of the substrate and the sputtered particles landing on the substrate. The flat substrate surface means a portion of the substrate surface except for a concave defect. FIG. 2 is a graph showing a relationship between an angle α and a film deposition rate of a multilayer reflective coating. In FIG. 2, the film deposition rate is shown as a relative value, wherein the film deposition rate is set at 1 when the angle α is 0°. The film deposition rate in FIG. 2 shows values, which were obtained when film deposition of a Mo/Si multilayer film (the target value of the total film thickness was 6.8 nm±0.1 nm, and the target value of a Mo/(Mo+Si) ratio was 0.34±0.1) was performed under the following conditions:

Film Deposition Conditions of the Si Film
 Target: Si target (Si single crystal, wherein e.g., boron or phosphorus having a comparatively high conductivity is doped in order to be prevented from being charged by Ar ions during sputtering).
 Sputtering gas: Ar gas (having a gas pressure of from 0.01 to 0.05 Pa, typically 0.03 Pa)
 Voltage: 600 V
 Beam current: 300 mA Film Deposition Conditions of the Mo Film
 Target: Mo target
 Sputtering gas: Ar gas (having a gas pressure of from 0.01 to 0.05 Pa, typically 0.03 Pa)
 Voltage: 600 V
 Beam current 300 mA As clearly seen from FIG. 2, the film deposition rate on a flat substrate surface has the greatest value when the angle α is 0° (when sputtered particles are landing vertically on the substrate surface), and the film deposition rate decreases when the angle α is not 0° (when the sputtered particles are landing obliquely on the substrate surface). As the angle α increases, the film deposition rate decreases.

Although not shown in FIG. 2, at the moment when the angle α has reached at a specific angle α', the film deposition rate on the flat substrate surface and the film deposition rate on a side wall of a concave defect become equal to each other. When the angle α satisfies the formula of α>α', the film deposition rate on the flat substrate surface becomes lower than the film deposition rate on the side wall of the concave defect.

Figure 3:
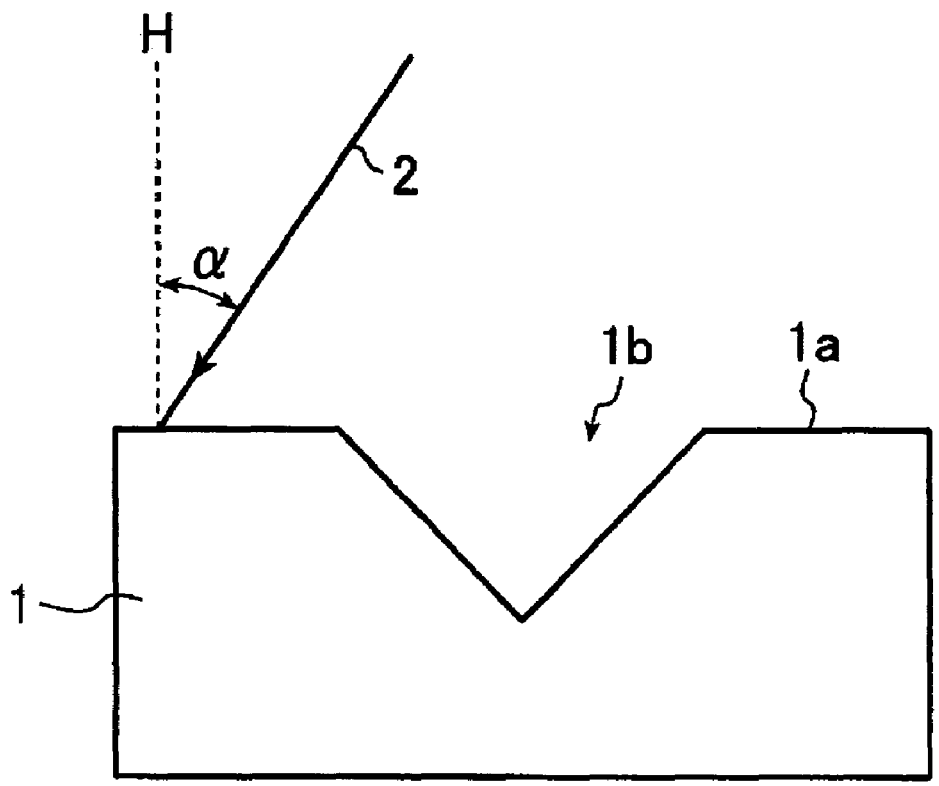
Figure 3:
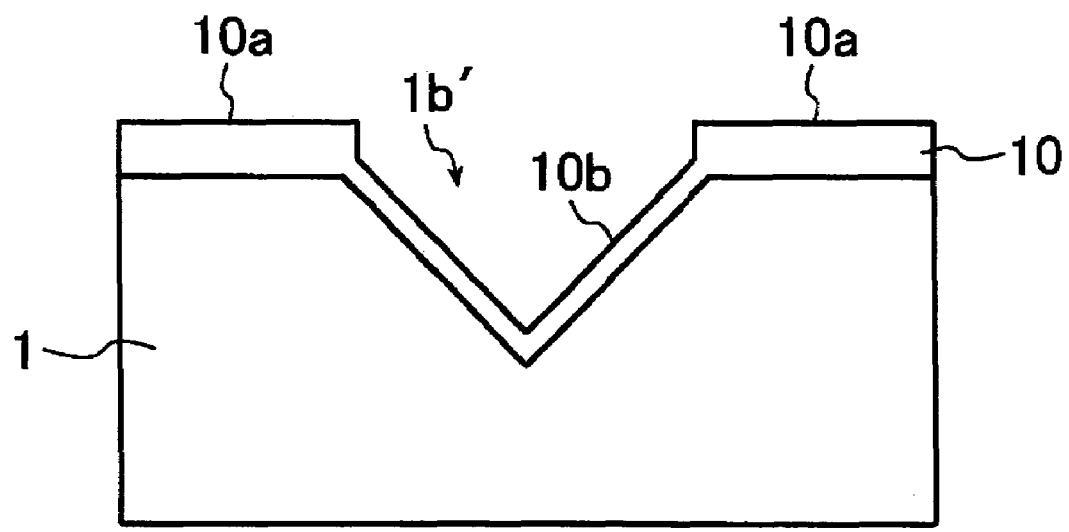
Figure 3:
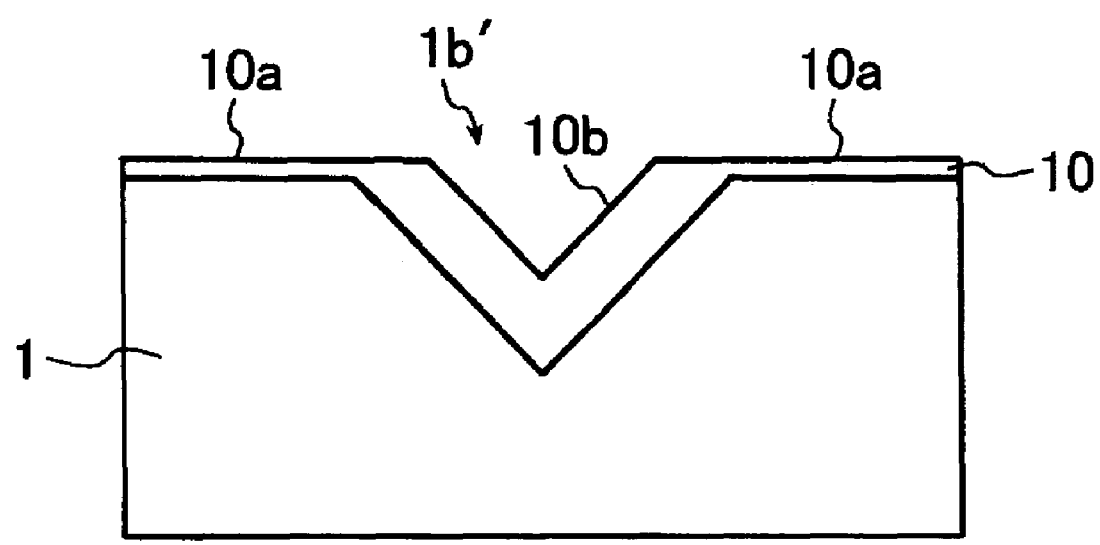

FIG. 3 contains schematic views showing a relationship between an angle α and a film thickness of each of multilayer reflective coatings, which are obtained when each of the multilayer reflective coatings is deposited on a substrate having a concave defect formed thereon. FIG. 3(a) is a view showing a substrate before film deposition, wherein a portion of the substrate in vicinity of the concave defect is schematically shown. In the substrate 1 shown in FIG. 3(a), a flat substrate surface 1a has the concave defect 1b formed in a substantially V-character shape. FIG. 3(b) shows a state wherein a multilayer reflective coating 10 has been deposited at a first angle α (α<α') to the substrate 1 shown in FIG. 3(a). Please note that an angle α of 0° is also contained in this state. As clearly shown from FIG. 3(b), a portion 10a of the multilayer reflective coating deposited on the flat substrate surface 1a has a greater film thickness than a portion 10b of the multilayer reflective coating deposited on a side wall of the concave defect 1b in the case of the first angle α (α<α'). This shows that the film deposition rate on the flat substrate surface 1a is higher than the film deposition rate on the side wall of the concave defect 1b. FIG. 3(c) shows a state wherein a multilayer reflective coating 10 has been deposited on a second angle α (α>α') on the substrate 1 shown in FIG. 3(a). As clearly seen from FIG. 3(c), a portion 10b of the multilayer reflective coating deposited on the side wall of the concave defect 1b has a greater film thickness than a portion 10a of the multilayer reflective coating deposited on the flat substrate surface 1a in the case of the second angle α (α>α'). This shows that the film deposition rate on the side wall of the concave defect 1b is higher than the film deposition rate on the flat substrate surface 1a.

In the first film deposition method according to the present invention, the portion 10b of the multilayer reflective coating deposited on the entire side wall of the concave defect 1b (e.g., both of the left and the right side wall positions of the concave defect 1b in this figure) has a greater film thickness than the portion 10a of the multilayer reflective coating deposited on the flat substrate surface 1a since the substrate 1 is rotated about the central axis 2 thereof as stated above. Additionally, the portion 10b of the multilayer film deposited on the entire side wall portions on the concave defect 1b has an equal film thickness.

A comparison of FIG. 3(a) with FIG. 3(c) clearly indicates that a concave defect 1b', which is formed on the multilayer reflective coating 10 after film deposition when film deposition is performed at the second angle α (α>α'), has a smaller size than the concave defect 1b formed on the substrate 1 before deposition of the multilayer reflective coating. By this function, the effect that the concave defect 1b formed on the substrate 1 has on the multilayer reflective coating 10 can be mitigated.

The angle α', at which the film deposition rate on a flat substrate surface 1a becomes equal to the film deposition rate on the side wall portions of a concave defect 1b, also varies according to, e.g., film deposition conditions or the size of the concave defect. The inventors have found that when the angle α is set so as to satisfy the formula of 35°≦α≦80°, the effect that a concave defect formed on a substrate surface has on a multilayer reflective coating can be mitigated even if film deposition conditions or the like are changed to some extent.

In summery, the first film deposition method according to the present invention is characterized in that ion beam sputtering is preformed, maintaining the angle α so as to satisfy the formula of 35°≦α≦80°.

The sputtered particles 2 land on the substrate 1, normally having a spread to extent. The angle α means the central angle of the sputtered particles 2 landing on the substrate 1, having a spread to some extent.

When the angle α is set so as to satisfy the formula of 35°≦α≦80°, the effect that the concave defect 1b formed on the substrate 1 has on the multilayer reflective coating 10 can be sufficiently mitigated. For example, it was verified in an example stated later that when a Mo/Si multilayer reflective coating was deposited at an angle α of 50° so as to have a thickness of 350 nm, the size of concave defects formed on the substrate was decreased by 10% on average in terms of the diameter of D of a sphere having a volume equal to a volume v defined in FIG. 8 (spherical equivalent diameter). It was also verified that when a multilayer reflective coating was deposited at an angle α of 70°, the size of concave defects formed on a substrate was decreased by 23% on average in terms of the above-defined spherical equivalent diameter D.

When the angle α is less than 35°, the effect that the concave defect 1b formed on the substrate 1 has on the multilayer reflective coating 10, is insufficiently mitigated. In some cases, a concave defect formed on a multilayer reflective coating after film deposition has a larger size than concave defect before film deposition under film deposition conditions or the like. For example, it was verified, in an example stated later that when a Mo/Si multilayer reflective coating was deposited at an angle α of −28° so as to have a thickness of 350 nm, the size of concave defects formed on a substrate was increased by 21% on average in terms of the above-defined spherical equivalent diameter D. On the other hand, when the angle α is larger than 80°, the time period required for deposition of a multilayer reflective coating 10 increases since the film deposition rate of the portion 10a of the multilayer reflective coating on the flat substrate surface 1a becomes too low.

It is more preferred that the angle α be set so as to satisfy the formula of 40°≦α≦70°.

In accordance with the present invention, the criterion for a concave defect formed on a substrate for film deposition, more specifically, the criterion for the size of such a concave defect is mitigated.

According to the ITRS road map, 2003 edition, the defect size that is permissible in a photomask for fabricating a device having a half pitch of 45 nm is a diameter of 32 nm in terms of PSL equivalent particle size. When a multilayer reflective coating is deposited at an angle α of −28°, the size of concave defects on the substrate increases by 21% on average as stated above in terms of the above-defined spherical equivalent diameter D, which is supposed to be substantially comparable to the PSL equivalent particle size. This means that the size of a concave defect permissible on a substrate before film deposition is 25 nm. However, since this size is determined without considering an effect caused by perturbation in the periodic structure of a multilayer reflective coating generated by a concave defect on a substrate, there is a possibility that the size of a concave defect permissible on the substrate is much smaller than the above-mentioned value.

On the other hand, when a multilayer reflective coating is deposited at an angle α of 70° as shown in an example stated later, the size of concave defects on the substrate is decreased by 23% on average in terms of the above-defined spherical equivalent diameter D. This means that the size of a concave defect permissible on a substrate before film deposition is 42 nm in this case.

In particular, when the angle α is set so as to satisfy the formula of $40° \leq \alpha \leq 70°$, the size of concave defects on a substrate is decreased by from 5% to 30% on average in terms of the above-defined spherical equivalent diameter D.

In the first film deposition method according to the present invention, it is preferred from the viewpoint of ensuring uniformity in the film thickness of a multilayer reflective coating that the substrate 1 have a rotational speed of from 1 to 60 rpm.

In the first film deposition method according to the present invention, it is only essential that when a multilayer reflective coating is deposited, ion beam sputtering is performed so that the angle α is maintained so as to satisfy the formula of $35° \leq \alpha \leq 80°$ while rotating a substrate 1 about the central axis 2 of the substrate. Other film deposition conditions may be properly selected as needed.

For example, the target and the sputtering gas may be selected according to a multilayer reflective coating to deposit. Specific examples of the multilayer reflective coating for an EUV mask blank are a Mo/Si multilayer reflective coating, a Ru/Si multilayer reflective coating, a Rh/Si multilayer reflective coating, a Pt/Si multilayer reflective coating, a RuMo/Si multilayer reflective coating, and a RuMo/Y multilayer reflective coating. In the first film deposition method according to the present invention, it is possible to deposit all these multilayer reflective coatings by selecting a desired target and a desired sputtering gas.

Film deposition conditions, such as the gas pressure of a sputtering gas, an ion acceleration voltage and a film deposition rate, may be properly selected according to a multilayer reflective coating to deposit. For example, when a Mo/Si multilayer reflective coating is deposited, an Si target (a Si single crystal, wherein boron or phosphorus having a comparatively high conductivity is doped in order to be prevented from being charged by Ar ions during sputtering) is used as the target, and an Ar gas (having a gas pressure of 0.03 Pa) is used as the sputtering gas to deposit an Si film at a voltage of 600 V and at a beam current of 300 mA. Next, a Mo target is used as the target, and an Ar gas (having a gas pressure of 0.03 Pa) is used as the sputtering gas to deposit a Mo film at a voltage of 600 V and at a beam current of 300 mA, thus forming the minimum unit of (Mo/Si dual-layer film) of the Mo/Si multilayer reflective coating, which comprises a single Mo film deposited on a single Si film. The Mo/Si dual-layer film is configured so that the total film thickness has a target value of 6.8 nm±0.1 nm, and that the Mo/(Mo+Si) ratio has a target value of 0.34±0.1 for example. The Mo/Si multilayer reflective coating is deposited by laminating such a Mo/Si dual-layer film 30 times to 60 times.

The film portion conditions listed above may be optimized according to the requirements for the optical characteristics of a multilayer reflective coating, such as a wavelength having a peak reflectivity, a peak reflectivity and uniformity in reflectivities.

By the first film deposition method according to the present invention, it is possible to deposit a multilayer reflective coating at a desired thickness as required. In order to sufficiently achieve the effect of reducing the perturbation in the periodic structure of a multilayer reflective coating caused by a concave defect formed on a substrate surface, it is preferred that the multilayer reflective coating have a thickness of 200 nm or above. When the multilayer reflective coating has a thickness of 200 nm, it is possible to reduce the perturbation in the periodic structure of the multilayer reflective coating to a practically acceptable level as an EUV mask blank. The multilayer reflective coating has a thickness of preferably 300 nm or above, more preferably from 300 nm to 500 nm in terms of smoothness of a substrate surface, optical characteristics of a substrate, film stress and the like.

In the first film deposition method according to the present invention, a capping layer may be deposited as a film on a multilayer reflective coating after the multilayer reflective coating has been deposited on a substrate according the steps stated above. The film deposition of such a capping layer is effective to prevent a surface of the multilayer reflective coating from being oxidized. Specific examples of the material forming the capping layer are Ru, Si, C, SiC, and SiN.

Film deposition conditions for the capping layer may be properly selected according to the material forming the capping layer. For example, when a Si layer is deposited as the capping layer on a Mo/Si multilayer reflective coating deposited according to the steps stated above, the Si layer may be deposited as the highest layer of the Mo/Si multilayer reflective coating. It is preferred that the capping layer have a film thickness of 11.0±2 nm.

Although film deposition of the capping layer may be carried out by an ion beam sputtering method, the film deposition of the capping layer is not limited to this method. Film deposition of the capping layer may be carried out by another film deposition method, such as a magnetron sputtering method. From the viewpoint of minimizing the generation of foreign particles during film deposition and being capable of carrying out extremely precise film deposition, it is preferred to carry out the film deposition by an ion beam sputtering method.

A second mode according to the present invention relates to a method depositing a multilayer reflective coating on a substrate for film deposition and depositing a capping layer on the multilayer reflective coating by ion beam sputtering (hereinbelow referred to as "the second film deposition method according to the present invention").

In the second film deposition method according to the present invention, the steps for depositing the multilayer reflective coating on the substrate for film deposition are performed in the same way as the first film deposition method according to the present invention. The steps for depositing the capping layer are also performed in the same steps as the deposition of the multilayer reflective coating. In other words, when the capping layer is deposited, ion beam sputtering is performed so that the angle α is maintained so as to satisfy the formula of $35° \leq \alpha \leq 80°$ while rotating the substrate 1 about the central axis 2 of the substrate.

In the second film deposition method according to the present invention, the preferred ranges of the angle α and the rotational speed of the substrate 1 are the same as those stated with respect to the deposition of the multilayer reflective coating in the first film deposition method according to the present invention. With respect to the material forming the capping layer, the explanation stated above is applicable. Specific examples of the material are Ru, Si, C, SiC, and SiN.

In the second film deposition method according to the present invention, it is preferred that the capping layer and the multilayer reflective coating have a total thickness of 200 nm or above. When the multilayer reflective coating and the capping layer have a total thickness of 200 nm or above, the size of a concave defect formed on a surface of the capping layer can be reduced to a practically acceptable level as an EUV mask blank. It is more preferred that the multilayer reflective coating and the capping layer have a total thickness of from 250 nm to 510 nm.

As explained in reference to FIG. 3, in accordance with the method of the present invention, it is possible to mitigate the effect that the concave defect 1b formed on the substrate 1 has on the multilayer reflective coating 10. However, the size of the concave defect 1b' formed on the multilayer reflective coating 10 after film deposition cannot be reduced to a practically acceptable level as an EUV mask blank, depending on the film thickness of the deposited multilayer reflective coating, in some cases.

In the second film deposition method according to the present invention, it is possible to obtain a similar effect to the case shown in FIG. 3 even when the capping layer is deposited. In other words, the size of a concave defect formed on the capping layer is much smaller than the size of the concave defect 1b' formed on the multilayer reflective coating. Accordingly, the size of the concave defect formed on the capping layer after film deposition can be reduced to a practically acceptable level as an EUV mask blank.

In the present invention, the effect that a concave defect formed on a substrate has on a multilayer reflective coating may be reduced by disposing an underlayer between the multilayer reflective coating and the substrate having the concave defect formed thereon.

A third mode of the present invention relates to a method for depositing an underlayer on a substrate with a concave defect by an ion beam sputtering method (hereinbelow referred to as "the third film deposition method according to the present invention").

In the third film deposition method according to the present invention, the steps for depositing the underlayer on a substrate for film deposition so as to be disposed on a side of a multilayer reflective coating close to the substrate are performed in the same way as the steps for depositing the multilayer reflective coating by the first film deposition method according to the present invention. In other words, when the underlayer is deposited, ion beam sputtering is performed so that the angle α is maintained so as to satisfy the formula $35° \leq \alpha \leq 80°$ while rotating the substrate about the central axis of the substrate.

In the third film deposition method according to the present invention, it is possible to obtain a similar effect to the case shown in FIG. 3 when an underlayer is disposed. In other words, the size of a concave defect formed on the underlayer after film deposition become smaller than the size of a concave defect 1b formed on the substrate 1. As a result, it is possible to reduce the effect caused by the concave defect 1b formed on the substrate 1b. As long as the size of the concave defect formed on the underlayer is reduced to a practically acceptable level as an EUV mask blank, the above-mentioned steps are applicable.

In the third film deposition method according to the present invention, explanation of the film deposition of the multilayer reflective coating by the first film deposition method according to the present invention is also applicable to the preferred ranges of the angle α and the rotation speed range of the substrate 1.

In the third film deposition method according to the present invention, the underlayer may be deposited, using any material having an atomically smooth surface, such as at least one element selected from the group consisting of Si, Mo, C, B, Ni, W and Ru. The underlayer may be also deposited, using the same material as the multilayer reflective coating, such as Mo/Si, Ru/Si, Rh/Si, Pt/Si, Mo/Si, RuMo/Si, or RuMo/Y. The underlayer has the same fraction as the multilayer reflective coating (e.g., Mo/(Mo+Si) in the case of Mo/Si), the underlayer also functions as the multilayer reflective coating.

In the third film deposition method according to the present invention, it is preferred that the underlayer have a thickness of from 200 nm to 500 nm. When the underlayer has a thickness of 200 nm or above, the size of a concave defect formed on the underlayer after film deposition can be reduced to a practically acceptable level as a EUV mask blank.

By the third film deposition method according to the present invention, it is possible not only to provide the underlayer with a function of reducing the effect on a multilayer reflective coating caused by a concave defect formed on the substrate surface but also to provide the underlayer with a function of counteracting a film stress of the multilayer reflective coating deposited on the underlayer.

In general, a Mo/Si multilayer reflective coating having a peak reflectivity at about 13 to about 14 nm has a compressive stress of 400 to 500 MPa. Since there is a possibility that such a film stress damages the flatness of the substrate as one of the required characteristics for an EUV mask blank, it is preferred to reduce the film stress. When the underlayer is deposited on a substrate so as to have a tensile stress equal to such a compressive stress before depositing a multilayer reflective coating, it is possible to counteract the film stress and to prevent the flatness of the substrate from being damaged.

Specific examples of the material of the underlayer having such a compressive stress are Mo, Mo/Si having a high fraction of Mo, Mo/Be and Ru.

When the underlayer deposited by the third film deposition method according to the present invention comprises a Mo/Si multilayer film, the effect caused by a convex defect formed on a substrate surface can be also reduced by a known method for repairing a convex defect. For example, when an electron beam having a high resolution is irradiated on a portion of a Mo/Si multilayer film around a convex defect, the temperature in the irradiated portion is increased to accelerate the formation of a silicide. Since the silicide (MoSix) has a lower specific volume than a Mo/So dual-layer film, the convex defect can be made smaller, thereby reducing the perturbation in the structure of the underlayer caused by the convex defect formed on an substrate surface (the convex defect formed on the underlayer).

A known method for repairing a convex defect may be applied to an underlayer with a convex defect formed therein in order to smooth out the surface of the underlayer. Examples of the available method for smoothing out an underlayer surface are wet chemical mechanical polishing (CMP), ion beam etching using Ar ions, Kr ions or the like, etching using localized plasma and etching using a gas cluster ion beam.

In the underlayer deposited by the third film deposition method according to the present invention, the effect caused by a concave defect formed in a substrate surface can be reduced. Accordingly, the effects caused by both of a concave defect and a convex defect formed on the substrate surface can be reduced to provide the underlayer surface with excellent smoothness by applying a conventional method for repairing a convex defect, to the underlayer. When a multilayer reflective coating is deposited on the underlayer having such a high smoothness, it is possible to provide the multilayer reflective coating with excellent smoothness.

A fourth mode according to the present invention relates to a method for depositing an underlayer on a substrate for film deposition by an ion beam sputtering method and depositing a multilayer reflective coating on the underlayer by a sputtering method (hereinbelow referred to as "the fourth film deposition method according to the present invention").

In the fourth film deposition method according to the present invention, the steps for depositing an underlayer on a substrate for film deposition are performed in the same way as the third film deposition method according to the present invention.

In the fourth film deposition method according to the present invention, it is preferred that the underlayer have a thickness of from 200 nm to 500 nm. When the underlayer has a thickness of 200 nm or above, the size of a concave defect formed on the underlayer can be reduced to a practically acceptable level as an EUV mask blank.

In the fourth film deposition method according to the present invention, there is no limitation to the steps for depositing a multilayer reflective coating on an underlayer, as long as the steps are performed by a sputtering method. From this viewpoint, when a multilayer reflective coating is deposited by an ion beam sputtering method, there is no limitation to the incident angle $\alpha$ of sputtered particles to a normal line of a substrate. In other words, sputtered particles may land on the substrate surface at an angle of $\alpha=0°$, i.e., vertically to the substrate surface. The deposition of the multilayer reflective coating may be carried out by a sputtering method other than an ion beam sputtering method, such as a magnetron sputtering method.

However, it is preferred from the viewpoint of minimizing the generation of foreign particles during film deposition and of performing film deposition with a high precision that the deposition of the multilayer reflective coating be carried out by an ion beam sputtering method.

In the fourth film deposition method according to the present invention, there is no limitation to the thickness of the multilayer reflective coating deposited on the foundation film since the size of a concave defect formed on the underlayer is reduced to a practically acceptable level as an EUV mask blank. However, from the viewpoint of the multilayer reflective coating having as extremely high a reflectivity as possible at the wavelength of a light source, minimizing the film stress in the multilayer reflective coating to prevent the substrate from being deformed by the film stress, and the like, the thickness of the multilayer reflective coating is preferably 200 nm or above, more preferably from 250 nm to 350 nm.

As long as the size of a concave defect formed on the underlayer can be reduced to a practically acceptable level as an EUV mask blank, it is sufficient to carry out only the second film deposition method or the third film deposition method according to the present invention.

However, in some cases, the size of a concave defect formed on an underlayer cannot be reduced to a practically acceptable level as an EUV mask blank, depending on the thickness of the deposited underlayer. A fifth mode according to the present invention aims at solving this problem and relates to a method depositing an underlayer on a substrate for film deposition and depositing a multilayer reflective coating on the underlayer by an ion beam sputtering method (hereinbelow referred to as "the fifth film deposition method according to the present invention").

In the fifth film deposition method according to the present invention, the steps for depositing an underlayer on a substrate for film deposition are carried out in the same way as the third film deposition method according to the present invention. The steps for depositing a multilayer reflective coating on the underlayer are carried out in the same way as the steps for depositing the multilayer reflective coating on the substrate for film deposition in the first film deposition method according to the present invention. In other words, when the fifth film deposition method according to the present invention is carried out, the effect caused by a concave defect formed on a substrate can be reduced since the function shown in FIG. 3 is caused at the time of film deposition of the underlayer and at the time of film deposition of the multilayer reflective coating. Accordingly, the fifth film deposition method has an advantage in mitigating the effect caused by the concave defect formed on the substrate.

In the fifth film deposition method according to the present invention, it is preferred that the underlayer and the multilayer reflective coating have a total thickness of 200 nm or above. When the underlayer and the multilayer reflective coating have a total thickness of 200 nm, the size of a concave defect formed on the multilayer reflective coating can be reduced to a practically acceptable level as an EUV mask blank. It is more preferred that the underlayer and the multilayer reflective coating have a total thickness of from 250 nm to 500 nm.

A sixth mode according to the present invention relates to a method depositing an underlayer on a substrate for film deposition, depositing a multilayer reflective coating on the underlayer and depositing a capping layer on the multilayer reflective coating by an ion beam sputtering method (hereinbelow referred to as "the sixth film deposition method according to the present invention").

In the sixth deposition method according to the present invention, the steps for depositing an underlayer on a substrate for film deposition are carried out in the same way as the third film deposition method according to the present invention. The steps for depositing a multilayer reflective coating on the underlayer, and the steps for depositing a capping layer of the multilayer reflective coating are carried out in the same way as the second film deposition method according to the present invention. Accordingly, when the sixth film deposition method according to the present invention is carried out, the effect caused by a concave defect formed on a substrate can be reduced since the function shown in FIG. 3 is caused at the time of film deposition of the underlayer, at the time of film deposition of the multilayer reflective coating and at the time of film deposition of the capping layer. Accordingly, the sixth film deposition method has an advantage in reducing the effect caused by the concave defect formed on the substrate.

In the sixth film deposition method according to the present invention, it is preferred that the underlayer, the multilayer reflective coating and the capping layer have a total thickness of 200 nm or above. When the underlayer, the multilayer reflective coating and the capping layer have a total thickness of 200 nm or above, the size of a concave defect formed on the capping layer can be reduced to a practically acceptable level as an EUV mask blank. The underlayer, the multilayer reflective coating and the capping layer have a total thickness of preferably 250 nm or above, more preferably from 300 nm to 800 nm.

The present invention also provides a method fabricating an EUV mask blank by using the above-mentioned steps to deposit a multilayer reflective coating on a substrate for film deposition, followed by depositing an absorbing layer on the multilayer reflective coating.

A seventh mode according to the present invention relates to a method for fabricating an EUV mask blank by using the first film deposition method according to the present invention to deposit a multilayer reflective coating on a substrate for film deposition, followed by using a sputtering method to deposit an absorbing layer on the multilayer on the multilayer reflective coating (hereinbelow referred to as "the first mask blank fabrication method according to the present invention").

By the first mask blank fabrication method according to the present invention, a concave defect formed on a multilayer reflective coating can be reduced to a practically acceptable level as a EUV mask blank in the multilayer reflective coating after film deposition since the multilayer reflective coating is deposited on the substrate by the first film deposition method according to the present invention. Accordingly, it is possible to fabricate a high quality EUV mask blank having defects minimized by depositing an absorbing layer on the multilayer reflective coating.

There is no limitation to the steps for depositing the absorbing layer on the multilayer reflective coating as long as the deposition is carried out by a sputtering method. In other words, when the multilayer reflective coating is deposited by an ion beam sputtering method, the incident angle $\alpha$ of sputtered particles to the substrate surface is not limited to a particular value. Sputtered particles may land on the substrate surface at an angle of $\alpha=0°$, i.e., vertically to the substrate surface. Film deposition of the absorbing layer may be carried out by a sputtering method other then an ion beam sputtering method, such as a magnetron sputtering method.

Examples of the material forming the absorbing layer are Cr, TaN, and TaBN. It is preferred that the absorbing layer have a thickness of 50 to 100 nm. As an upper layer of the absorbing layer, a low reflective coating having a low reflectance may be disposed.

The film deposition conditions for the absorbing layer may be properly selected in accordance with the material forming the absorbing layer, the used film deposition method or the like. For example, when a Cr film is deposited as the absorbing layer by an ion beam sputtering method, the film may be deposited so as to have a thickness of from 50 to 100 nm, using a Cr target as the target, using an Ar gas (having a gas pressure of from $1.3 \times 10^{-2}$ Pa to $4.0 \times 10^{-2}$ Pa) as the sputtering gas, applying a voltage of from 400 to 800 V and setting the film deposition speed at a value of from 0.06 to 0.09 nm/sec.

The first mask blank fabricating method according to the present invention has been described about the case of fabricating an EUV mask blank comprising a substrate, a multilayer reflective coating and an absorbing layer. However, an EUV mask blank containing an element other than the above-mentioned elements can be fabricated by the first mask blank fabricating method according to the present invention. For example, a capping layer may be deposited on the multilayer reflective coating after having deposited the multilayer reflective coating. In this case, the film deposition of the capping layer may be carried out as stated in paragraphs 0046 and 0047. The multilayer reflective coating and the absorbing layer may have a buffer layer disposed therebetween. The buffer layer is disposed for the purpose of protecting the multilayer reflective coating in order to prevent the multilayer reflective coating from being damaged when an etching process is used to dispose the absorbing layer by patterning. Examples of the material forming the buffer layer are Cr, Al, Ru, Ta, a nitride thereof, $SiO_2$, $Si_3N_4$, and $Al_2O_3$. It is preferred that the buffer layer have a thickness of from 10 to 60 nm.

The film deposition of the buffer layer may be carried out by a well-known film deposition method, such as magnetron sputtering method or an ion beam sputtering method. The film deposition conditions for the buffer layer may be properly selected in accordance with the material forming the buffer layer, the used film deposition method or the like. For example, when an $SiO_2$ film is deposited by an ion beam sputtering method, the film may be deposited so as to have a thickness of from 10 to 60 nm, using an Ar gas and an $O_2$ gas (having a gas pressure of from $2.7 \times 10^{-2}$ Pa to $4.0 \times 10^{-2}$ Pa) as the sputtering gas, applying a voltage of from 1,200 to 1,500 V and setting the film deposition speed at a value from 0.01 to 0.03 nm/sec.

An eighth mode according to the present invention relates to a method for fabricating an EUV mask blank by using the third film deposition method according to the present invention to deposit an underlayer, then using a sputtering method to deposit a multilayer reflective coating on the underlayer, and then using a sputtering method to deposit an absorbing layer on the multilayer reflective coating (hereinbelow referred to as "the second mask blank fabrication method according to the present invention").

In the second mask blank fabrication method according to the present invention, the steps for depositing an underlayer of a substrate for film deposition, and the steps for depositing a multilayer reflective coating layer are carried out in the same way as the fourth film deposition method according to the present invention. Accordingly, a concave defect formed on the underlayer can be reduced to a practically acceptable level as an EUV mask blank in the underlayer after film deposition. By depositing the multilayer reflective coating and the absorbing layer after that, it is possible to fabricate a high quality EUV mask blank having defects minimized.

In the second mask blank fabrication method according to the present invention, the steps for depositing the absorbing layer on the multilayer reflective coating are carried out in the same way as the steps for depositing the absorbing layer on the multilayer reflective coating in the first mask blank fabrication method according to the present invention.

A ninth mode according to the present invention relates to a method for fabricating an EUV mask blank by using the fifth film deposition method according to the present invention to deposit an underlayer and a multilayer reflective coating on a substrate for film deposition, and then using a sputtering method to deposit an absorbing layer on the multilayer reflective coating (hereinbelow referred to as "the third mask blank fabrication method according to the present invention").

In the third mask blank fabrication method according to the present invention, a concave defect formed on a multilayer reflective coating can be reduced to a practically acceptable level as an EUV mask blank in the multilayer reflective coating after film deposition since an underlayer and the multilayer reflective coating are deposited on a substrate for film deposition by the fifth film deposition method according to the present invention. By depositing an absorbing layer on the multilayer reflective coating after that, it is possible to fabricate a high quality EUV mask blank having defects minimized.

In the third mask blank fabrication method according to the present invention, the steps for depositing the absorbing layer on the multilayer reflective coating are carried out in the same way as the steps for depositing the absorbing layer on the multilayer reflective coating in the first mask blank fabrication method according to the present invention.

A tenth mode according the present invention relates to a method for fabricating an EUV mask blank by using the fifth film deposition method according to the present invention to deposit an underlayer and a multilayer reflective coating on a substrate for film deposition, then using an ion beam sputtering method to deposit a capping layer on the multilayer reflective coating, and then using a sputtering method to deposit an absorbing layer on the capping layer (hereinbelow referred to as "the fourth mask blank fabrication method according to the present invention").

In the fourth mask blank fabrication method according to the present invention, the steps for depositing an underlayer on a substrate for film deposition, the steps for depositing a multilayer reflective coating on the underlayer, and the steps for depositing capping layer on the multilayer reflective coating are carried out in the same way as the sixth film deposition method according to the present invention. Accordingly, a concave defect formed on a capping layer can be reduced to a practically acceptable layer as an EUV mask blank in the capping layer after the film deposition. By depositing an absorbing layer on the multilayer reflective coating after that, it is possible to fabricate a high quality EUV mask blank having defects minimized.

In the third mask blank fabrication method according to the present invention, the steps for depositing the absorbing layer on the capping layer are carried out in the same way as the steps for depositing the absorbing layer in the first mask blank fabrication method according to the present invention.

Now, the present invention will be further described, referring to examples.

EXAMPLE

In this example, an ion beam sputtering method was used to deposit a Mo/Si multilayer reflective coating on substrates having a concave defect formed thereon, and the relationship between an incident angle α of sputtered particles to a normal line of the substrates and the size of a concave defect formed on each of the Mo/Si multilayer reflective coatings were investigated.

In this example, substrates, each of which had a concave defect (having a diameter of 73 nm in PSL equivalent particle size) formed thereon, were used as substrates for film deposition. The substrate for film deposition were $SiO_2/TiO_2$ glass substrates (having outer dimensions of 6 inch (152.4 mm) square and a thickness of 6.3 mm), which had a coefficient of thermal expansion of $0.2 \times 10^{-7}/°$ C. and a Young's modulus of 67 GPa.

The glass substrates were preliminarily polished so as to have a surface roughness of 0.2 nm or below in Rms and a flatness of 100 nm or below, and the above-mentioned concave defect size is the value after polishing.

Figure 4:
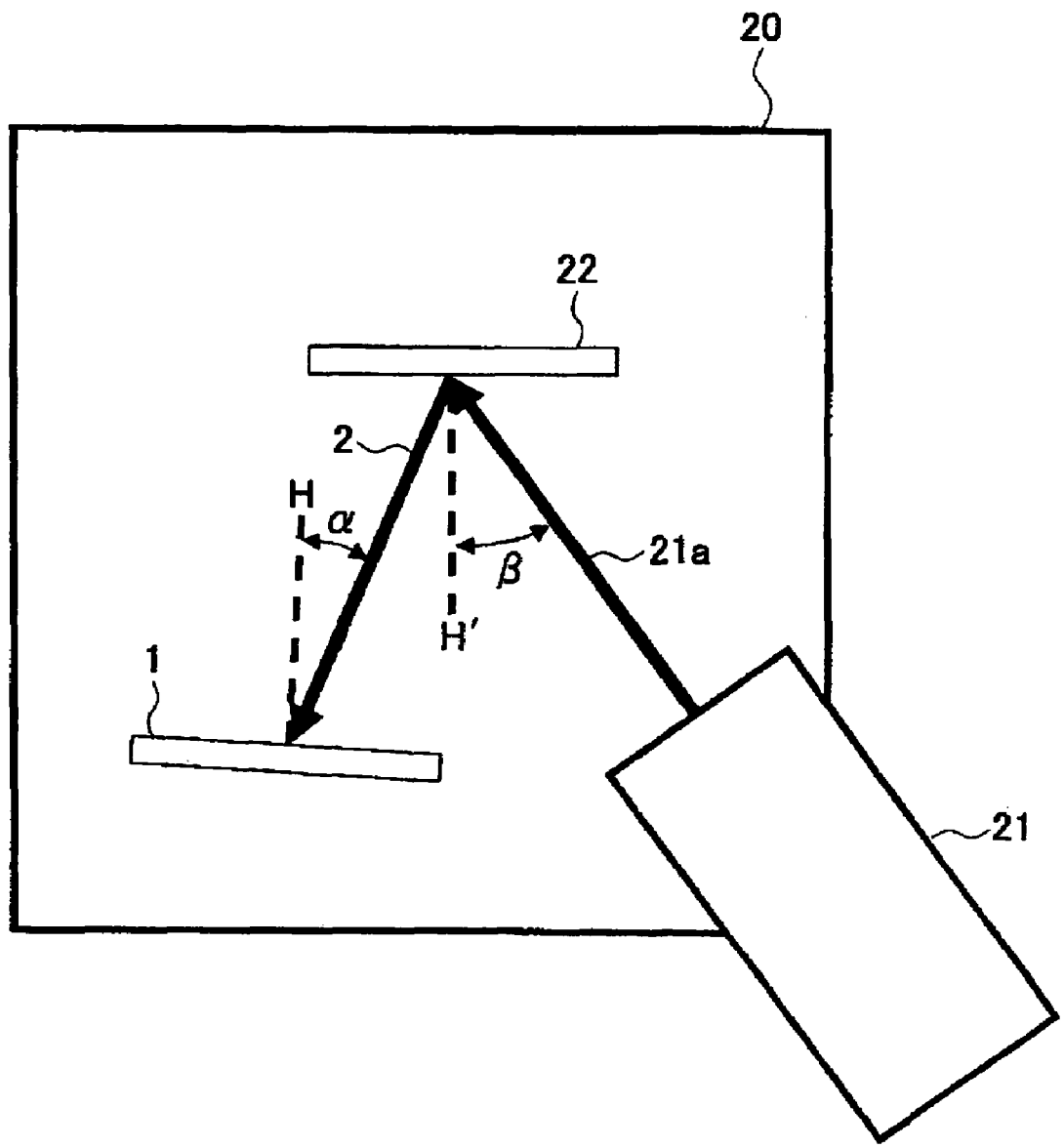
FIG. 4 is a schematic view of an ion beam sputtering system used for film deposition of each Mo/Si multilayer reflective coating.

FIG. 4 is a schematic view of the ion beam sputtering system (commercially available in the trademark "Nexus" of Veeco Instruments) used in the film deposition of the Mo/Si multilayer reflective coatings. In the ion beam sputtering system shown in FIG. 4, a chamber 20 is connected to a vacuum evacuation system (not shown) to be kept under vacuum therein during sputtering. The chamber 20 contains a sputtering target 22 and a substrate for film deposition 1. When an ion beam 21a is irradiated on the sputtering target 22 at a high speed from an ion source 21 mounted to a wall of the chamber 20, sputtered particles 2 are sputtered out from the sputtering target 22. The sputtered particles 2 thus sputtered out dispose a thin film on the substrate for film deposition 1. During sputtering, the substrate for film deposition 1 is rotated about the central axis thereof. In FIG. 4, the central axis of the substrate 1 accords with a normal line H of the substrate 1.

In FIG. 4, an angle β is a target angle β (an angle of the ion beam 22a with respect to a normal line H of the sputtering target 22), and the angle β was set at 43° for all the substrates in this example. An angle α is an angle of the sputtered particles 2 to the normal line H of the substrate 1. In this example, the angle α was varied in the range of from −28° to 70° (−28°, 0°, 40°, 55° and 70°). The angle α was varied by rotating each substrate 1 about a central portion of the substrate in a clockwise or counterclockwise direction in this figure. Please note that when each substrate 1 is rotated in the counterclockwise direction in this figure from the angle α=0° (a state wherein the sputtered particles 2 fall vertically on a substrate 1), the angle α is positive, and that when a substrate 1 is rotated in the clockwise direction in this figure from the angle α=0°, the angle α is negative. Accordingly, FIG. 4 shows a state wherein the angle α is positive.

Figure 5:
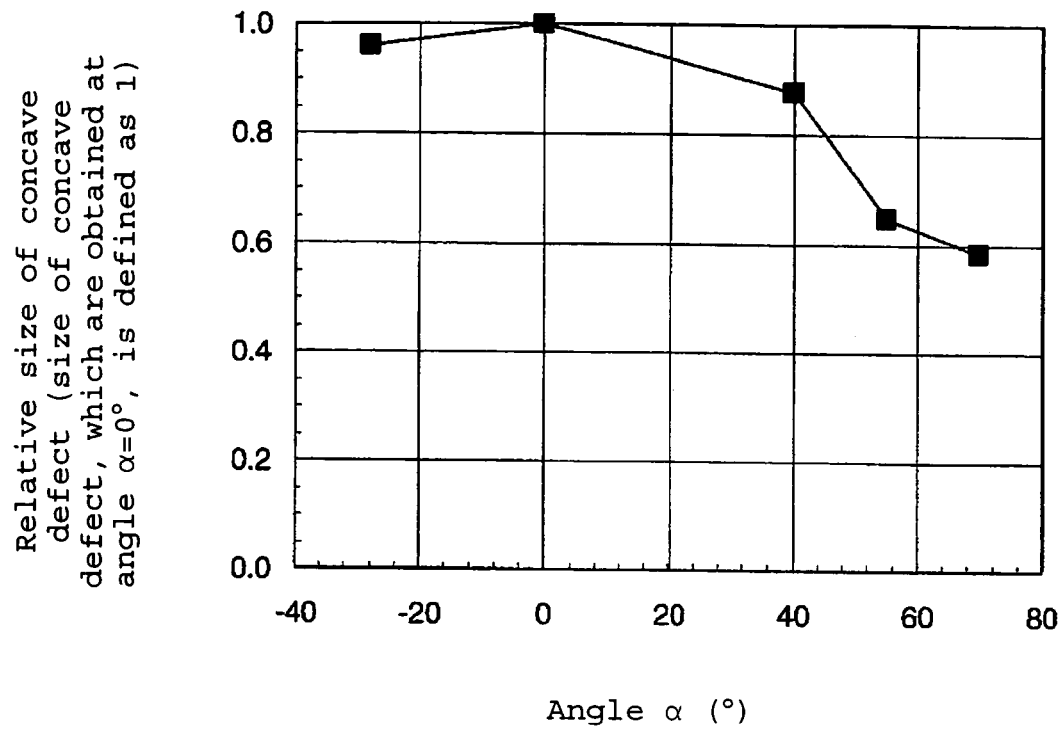
FIG. 5 is a graph showing evaluation results of the dependency that a size change in concave defects after film deposition has on a substrate angle.

A Mo/Si dual-layer film (having a target value of 6.8 nm±0.1 nm in total film thickness and a target value of 0.34±0.1 in Mo/(Mo+Si) ratio) was deposited on each substrate 1, and the deposition of such a Mo/Si dual-layer film was repeated 50 times to dispose a Mo/Si multilayer reflective coating. After that, a Si film was deposited at a thickness of about 4 nm as a capping layer. In each of the Mo/Si dual-layer films, the film deposition conditions for the Si film and the Mo film were as followed:

Film Deposition Conditions for the Si Film
   Target: Si target (Si single crystal with boron doped therein)
   Sputtering gas: Ar gas (having a pressure of 0.03 Pa)
   Voltage: 600 V
   Beam current: 300 mA Film Deposition Conditions for the Mo Film
   Target: Mo target
   Sputtering gas: Ar gas (having a gas pressure of 0.03 Pa)
   Voltage: 600 V
   Beam current: 300 mA The size of a concave defect after film deposition of each multilayer reflective coating was measured by a defect inspection machine (M1350 manufactured by Lasertech Corp.) to evaluate the dependence that the size of the concave defect after film deposition had on a substrate angle. The measurement results are shown in FIG. 5. In FIG. 5, the size of the concave defect after film deposition of each of the multilayer reflective coatings is shown as a relative size in the case wherein the size of the concave defect at angle α=0° was set at 1.

FIG. 5 reveals that when the angle α is 35° or above, the size of the concave defect formed on each of the multilayer reflective coatings after film deposition becomes smaller than the size before film deposition. It is also revealed that when the angle α satisfies the formula of $40° \leq \alpha \leq 70°$, the size of the concave defect formed on each of the multilayer reflective coatings after film deposition becomes particularly smaller than the size before film deposition.

Figure 6:
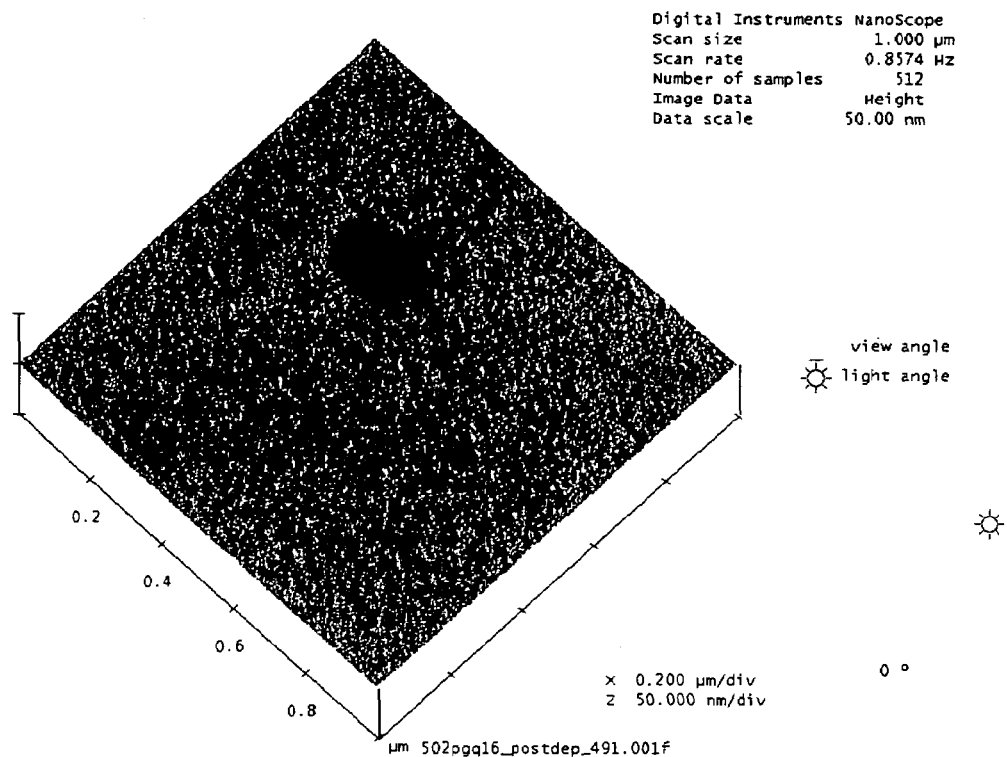
Figure 6:
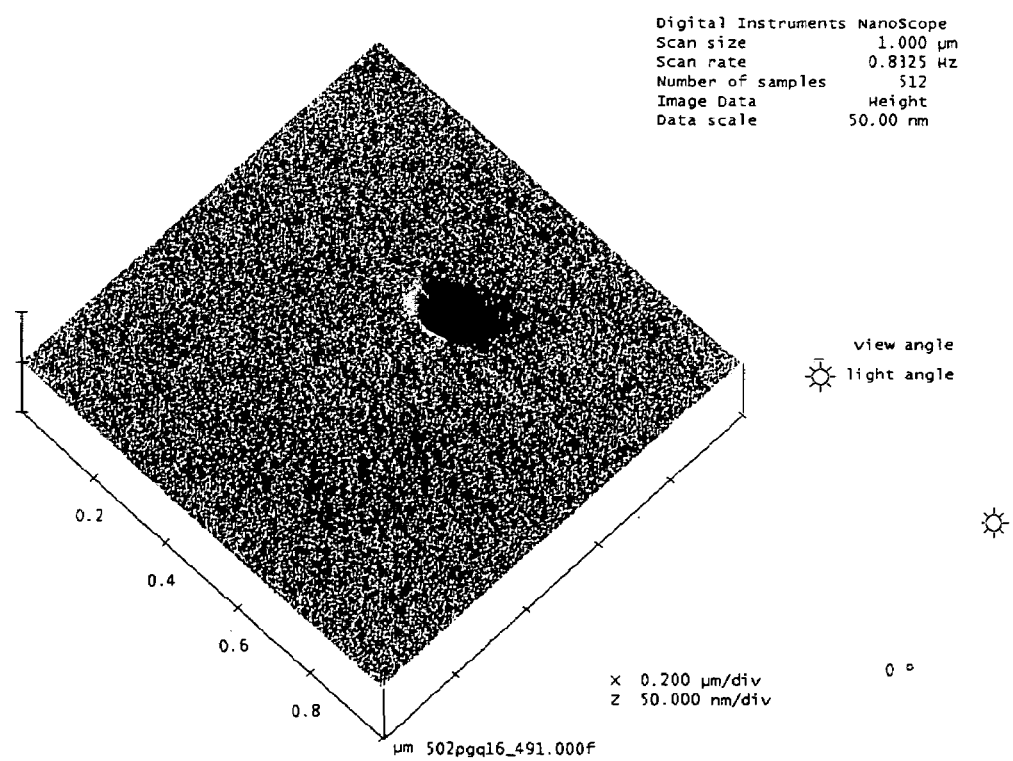
Figure 7:
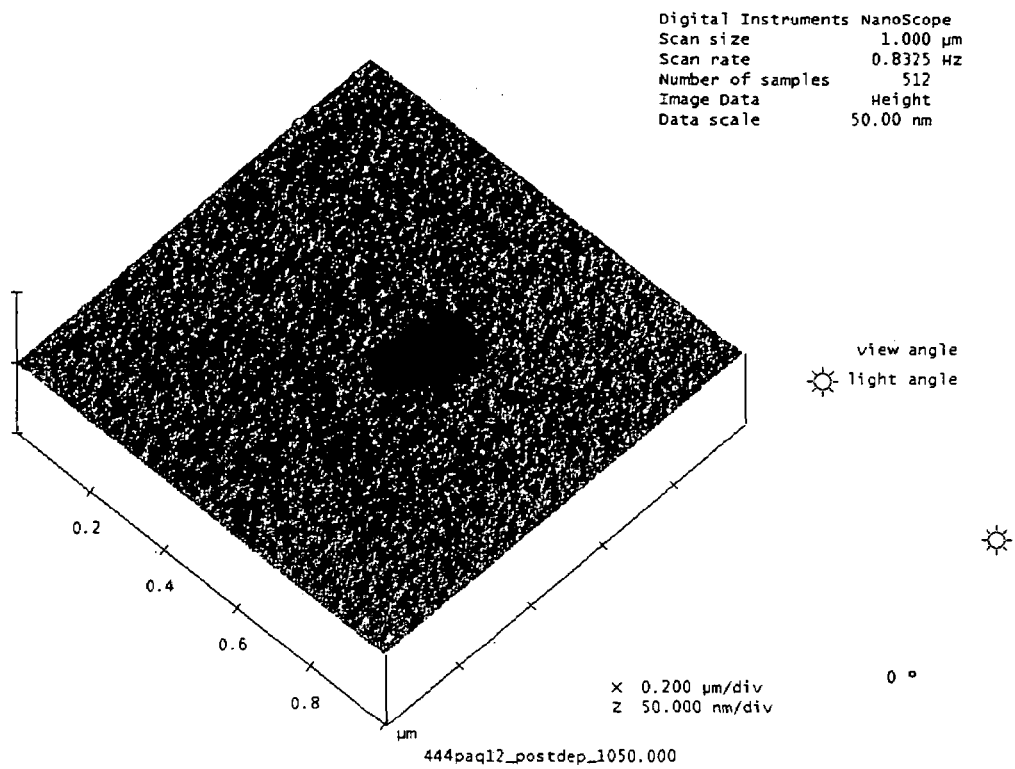
Figure 7:
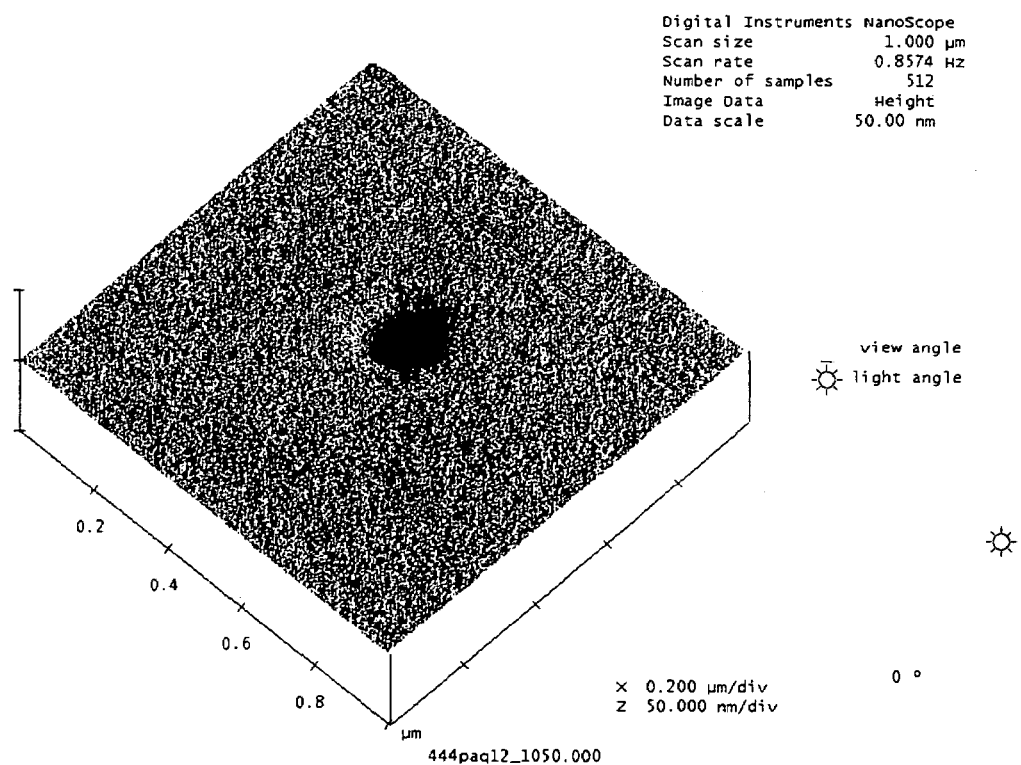

With respect to Mo/Si multilayer reflective coatings (having a film thickness of 7 nm), which were formed by laminating a Mo/Si film in fifty layers, setting the angle α at −28°, 50° and 70°, under the same film deposition conditions as the above-mentioned example, a change in size of each concave defect before and after film deposition was evaluated by an atomic force microscope (AMF: Dimension 9000 manufactured by Veeco Corp.). FIG. 6 shows AFM images in the vicinity of the concave defect that was deposited at an angle α=−28°, FIG. 6(a) shows an AFM image before film deposition, and FIG. 6(b) shows an AFM image after film deposition. FIG. 7 shows AFM images in the vicinity of the concave defect that was deposited at an angle α=50°, FIG. 7(a) shows and an AFM image before film deposition, and FIG. 7(b) shows an AFM image after film deposition.

The sizes of the concave defects shown in FIG. 6 and FIG. 7 are as follows:

FIG. 6(a) (Before Film Deposition)
   Depth (d): 28.5 nm
   Half width: 77 nm
   Volume (v): 124,879 $nm^3$ FIG. 6(b) (After Film Deposition)
   Depth (d): 22.9 nm
   Half width: 103 nm
   Volume (v): 172,617 $nm^3$ FIG. 7(a) (Before Film Deposition)
   Depth (d): 24.5 nm
   Half width: 94 nm
   Volume (v): 1,261,061 nm³

FIG. 7(b) (After Film Deposition)
   Depth (d): 15.8 nm
   Half width: 94 nm
   Volume (v): 123,582 nm³

Figure 8:
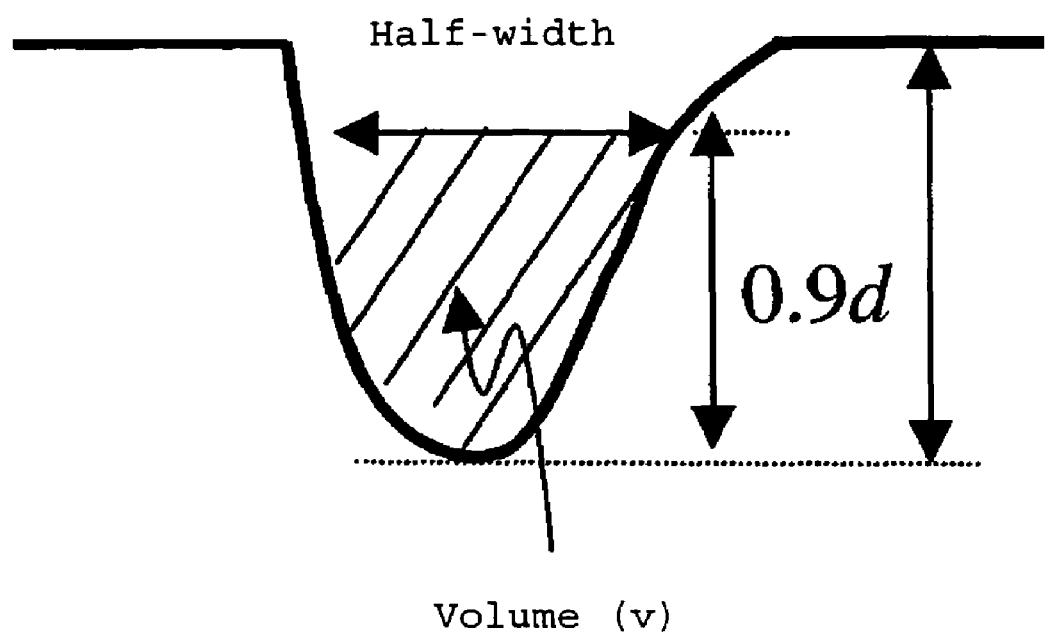
FIG. 8 is views showing how the depth, the half width and the volume of a concave defect are defined.

The depth, the half width and the volume of each of the concave defects are defined as shown in FIG. 8. It is reviewed that when film deposition was performed at an angle α of less than 35° (and angle α=−28°) as shown in FIG. 6, the size (in particular, the volume v) of the concave defect after film deposition becomes larger than that before film deposition, while, when film deposition is performed at an angle α of 35° or above (α=50°) as shown in FIG. 7, the size (in particular, the volume v) of the concave defect after film deposition becomes much smaller than that before film deposition. The fact that the size of a concave defect (in particular, the volume of a concave defect) becomes much smaller after film deposition shows that the perturbation in the periodic structure of the multilayer reflective coating is sufficiently reduced. In other words, it shows that the perturbation in the periodic structure of the multilayer reflective coating is reduced to a practically acceptable level as an EUV mask blank.

Substrates, each of which had a concave defect formed thereon so as to have a different size, were used, and the sizes of the concave defects before and after film deposition were compared to one another by carrying out the same steps as the above-mentioned steps. The size of each of the concave defects is represented by an expression, which is obtained by conversion to the diameter D of a share having a volume equal to the volume v of each of the concave defects defined as shown in FIG. 8 (spherical equivalent diameter). The spherical equivalent diameter D may be found by the following formula:

$$D=2(3v/4\pi)^{1/3}$$

Figure 9:
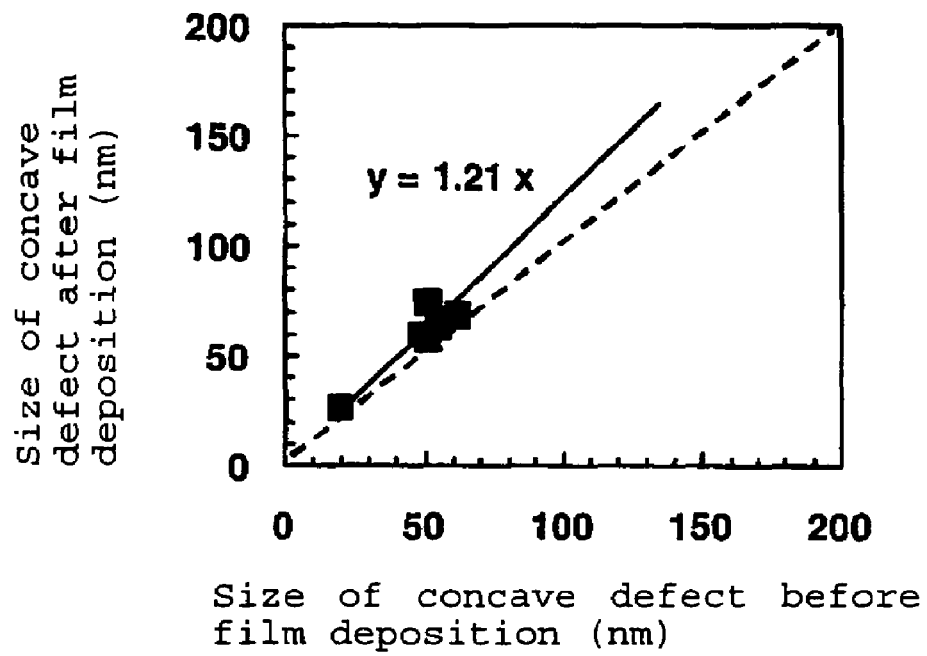
Figure 9:
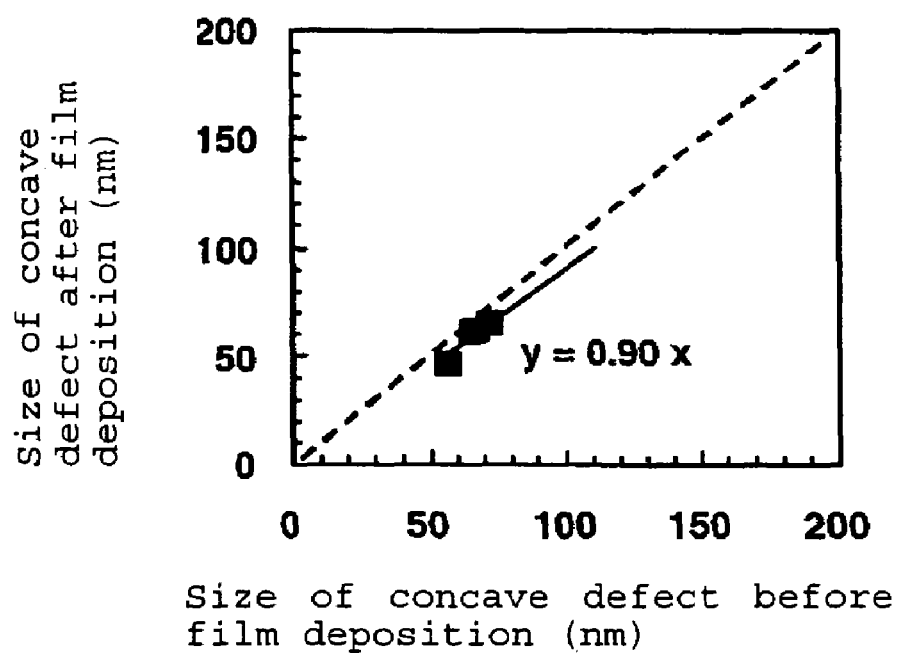
Figure 9:
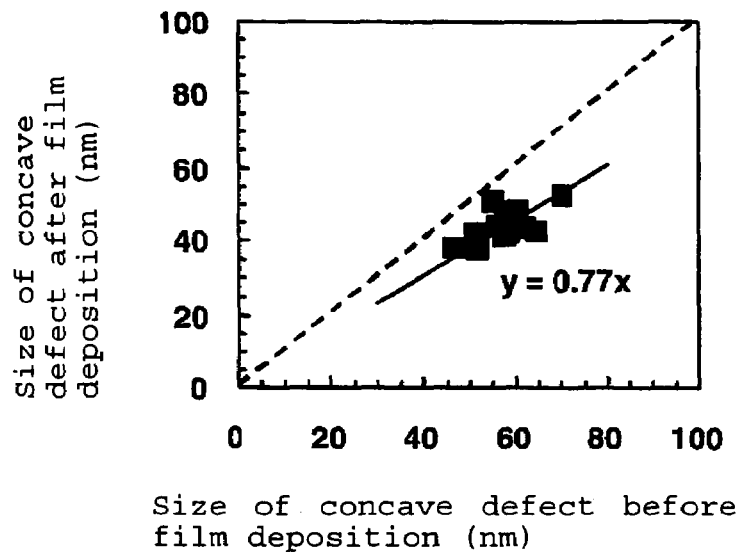

The spherical equivalent diameter D is supposed to be comparable to a PSL equivalent particle size. The comparison results are shown in FIG. 9. FIG. 9(a) shows a relationship among the sizes of concave defects before and after film deposition in a case wherein a multilayer reflective coating was deposited at the angle α=−28° on a substrate having the concave defects formed thereon. In FIG. 9(a), the horizontal axis represents the sizes of the concave defects before film deposition, and the vertical axis represents the sizes of the concave defects after film deposition. When dots are above a dotted line obliquely extending at an angle of 45° as shown in FIG. 9(a), it is shown that the sizes of the concave defects after film deposition are larger than that before film deposition. As clearly seen from FIG. 9(a), it was verified that when the multilayer reflective coating was deposited at an angle α=−28°, the sizes of the concave defects on the substrate was increased by 21% on average in terms of the spherical equivalent diameter D. FIG. 9(b) shows a relationship among the sizes of concave defects before and after film deposition in a case wherein a multilayer reflective coating was deposited at an angle α=50°. As clearly seen from FIG. 9(b), it was verified that when the multilayer reflective coating was deposited at an angle α=50°, the sizes of the concave defects on the substrate was reduced by 10% on average in terms of the spherical equivalent diameter D. FIG. 9(c) shows a relationship among the sizes of concave defects before and after film deposition in a case wherein a multilayer reflective coating was deposited at an angle α=70°. As clearly seen from FIG. 9(c), it was verified that when the multilayer reflective coating was disposed at an angle α=70°, the sizes of the concave defects on the substrate was reduced by 23% on average in terms of the spherical equivalent diameter D.

Figure 10:
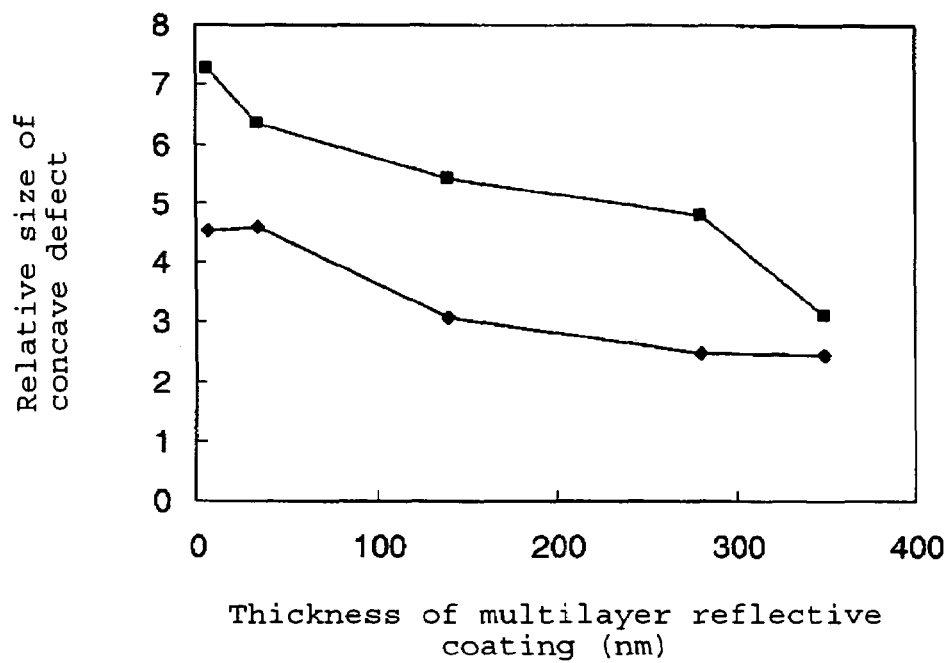
FIG. 10 is a graph showing evaluation results of the dependence that a size change of a concave defect before and after film deposition has on a film thickness.

In order to evaluate the dependence that a size change in concave defects before and after film deposition had on a film thickness, a Mo/Si multilayer reflective coating was deposited on substrates, which had different film thicknesses under the above-mentioned film deposition conditions. The angle α was set at 55°, and two kinds of substrates for film deposition, each of which had concave defects formed thereon so as to have a different size (37 nm and 52 nm in terms of the spherical equivalent diameter D) were used. The results are shown in FIG. 10. Although the relationship between a relative size of the concave defects and a PSL equivalent particle size is not clear in FIG. 10, the defect size of a concave defect decreases as the relative size decreases. As clearly seen from FIG. 10, it is proven that the size of a concave defect formed on a multilayer reflective coating after film deposition is decreased as the film thickness of the multilayer reflective coating increases. It is also proven that when the angle α is set at 55°, a concave defect formed on a multilayer reflective coating after film deposition is much smaller than that before film deposition by depositing the multilayer reflective coating at a film thickness of 100 nm or above, in particular 300 nm or above, further 400 nm or above.

What is claimed is:

1. A method for depositing, by ion beam sputtering, a multilayer reflective coating of a reflective mask blank for EUV lithography on a substrate having a concave defect formed thereon, comprising:
   carrying out ion beam sputtering so that an absolute value of an angle α formed between a normal line of a substrate and sputtered particles landing on the substrate is maintained so as to satisfy the formula of $35°\leqq\alpha\leqq 80°$ while rotating the substrate about a central axis thereof.

2. The method according to claim 1, further comprising:
   depositing a capping layer on the multilayer reflective coating by ion beam sputtering; and
   carrying out the ion beam sputtering so that an absolute value of an angle α formed between a normal line of the substrate and sputtered particles falling on the substrate is maintained so as to satisfy the formula of $35°\leqq\alpha\leqq 80°$ while rotating the substrate about a central axis thereof, when depositing the capping layer on the multilayer reflective coating.

3. A method for depositing, by ion beam sputtering, an underlayer of a reflective mask blank for EUV lithography on a substrate having a concave defect formed thereon, comprising:
   carrying out ion beam sputtering so that an absolute value of an angle α formed between a normal line of a substrate and sputtered particles falling on the substrate is maintained so as to satisfy the formula of $35°\leqq\alpha\leqq 80°$ while rotating the substrate about a central axis thereof, when depositing an underlayer on the substrate.

4. The method according to claim 3, further comprising depositing a multilayer reflective coating of a reflective mask blank for EUV lithography on the underlayer by sputtering.

5. A method for depositing a multilayer reflective coating of a reflective mask blank for EUV lithography on a substrate having a concave defect formed thereon, comprising:
   depositing an underlayer on a substrate by ion beam sputtering, and depositing a multilayer reflective coating on the underlayer by ion beam sputtering;
   carrying out the ion beam sputtering so that an absolute value of an angle α formed between a normal line of the substrate and sputtered particles landing on the substrate is maintained so as to satisfy the formula of $35° \leqq \alpha \leqq 80°$ while rotating the substrate about a central axis thereof, when depositing the underlayer and when depositing the multilayer reflective coating.

6. The method according to claim 5, further comprising:

depositing a capping layer on the multilayer reflective coating by ion beam sputtering; and carrying out the ion beam sputtering so that an absolute value of an angle $\alpha$ formed between a normal line of the substrate and sputtered particles falling on the substrate is maintained so as to satisfy the formula of $35° \leqq \alpha \leqq 80°$ while rotating the substrate about a central axis thereof, when depositing the capping layer.

7. A method for fabricating a reflective mask blank for EUV lithography, comprising:

depositing a multilayer reflective coating on a substrate by the method defined in claim 1; followed by depositing an absorbing layer on the multilayer reflective coating by sputtering.

8. A method for fabricating a reflective mask blank for EUV lithography, comprising:

depositing an underlayer on a substrate by the method defined in claim 3; followed by depositing a multilayer reflective coating of a reflective mask blank for EUV lithography on the underlayer by sputtering, and then;

depositing an absorbing layer on the multilayer reflective coating by sputtering.

9. A method for fabricating a reflective mask blank for EUV lithography, comprising:

depositing an underlayer and a multilayer reflective coating on a substrate by the method defined in claim 5; followed by depositing an absorbing layer on the multilayer reflective coating by sputtering.

10. A method for fabricating a reflective mask blank for EUV lithography, comprising:

depositing an underlayer and a multilayer reflective coating on a substrate by the method defined in claim 5; followed by depositing a capping layer on the multilayer reflective coating by ion beam sputtering, and depositing an absorbing layer on the capping layer by sputtering, and;

carrying out the ion beam sputtering so that an absolute value of an angle $\alpha$ formed between a normal line of the substrate and sputtered particles falling on the substrate is maintained so as to satisfy the formula of $35° \leqq \alpha \leqq 80°$ while rotating the substrate about a central axis thereof, when depositing the capping layer.

\* \* \* \* \*